US007026248B2

(12) United States Patent
Yamauchi et al.

(10) Patent No.: US 7,026,248 B2
(45) Date of Patent: Apr. 11, 2006

(54) METHOD FOR MANUFACTURING SEMICONDUCTOR DEVICE WITH SEMICONDUCTOR REGION INSERTED INTO TRENCH

(75) Inventors: Shoichi Yamauchi, Obu (JP); Nobuhiro Tsuji, Okazaki (JP)

(73) Assignee: Denso Corporation, Kariya (JP)

(*) Notice: Subject to any disclaimer, the term of this patent is extended or adjusted under 35 U.S.C. 154(b) by 259 days.

(21) Appl. No.: 10/347,190

(22) Filed: Jan. 21, 2003

(65) Prior Publication Data

US 2003/0139012 A1 Jul. 24, 2003

(30) Foreign Application Priority Data

Jan. 21, 2002 (JP) ............................ 2002-012171

(51) Int. Cl.
*H01L 21/302* (2006.01)

(52) U.S. Cl. ........................ 438/706; 438/41; 438/388; 438/700; 438/710

(58) Field of Classification Search ................ 438/706, 438/710, 712, 745, 700, 713, 41, 44, 388; 216/58, 73
See application file for complete search history.

(56) References Cited

U.S. PATENT DOCUMENTS

| | | | | |
|---|---|---|---|---|
| 4,754,310 | A | 6/1988 | Coe | |
| 5,814,562 | A * | 9/1998 | Green et al. | 438/708 |
| 6,521,538 | B1 | 2/2003 | Soga et al. | |
| 6,642,577 | B1 * | 11/2003 | Yamauchi et al. | 257/341 |
| 6,645,835 | B1 * | 11/2003 | Yamoto et al. | 438/503 |
| 6,667,196 | B1 * | 12/2003 | Yu et al. | 438/142 |
| 6,781,201 | B1 | 8/2004 | Yamaguchi | |

FOREIGN PATENT DOCUMENTS

| | | |
|---|---|---|
| EP | 1111685 | 12/2000 |
| JP | A-H10-12716 | 1/1998 |
| JP | A-S54-94775 | 7/1999 |

OTHER PUBLICATIONS

U.S. Appl. No. 09/696,951, filed Oct. 27, 2000, Yamauchi.
U.S. Appl. No. 09/688,154, filed Oct. 16, 2000, Yamaguchi.

* cited by examiner

*Primary Examiner*—Lan Vinh
(74) *Attorney, Agent, or Firm*—Posz Law Group, PLC

(57) ABSTRACT

In a method for manufacturing a semiconductor device of the present invention, a portion of a first epitaxial layer formed in a trench in a silicon substrate is removed by vapor phase etching using a halogenated compound or hydrogen. In this removing process, the portion of the first epitaxial layer is removed at a predetermined temperature higher than that during epitaxial growth of the first epitaxial layer and at a predetermined pressure higher than that during epitaxial growth of the first epitaxial layer. Therefore, stress that would otherwise be concentrated at a bottom portion of the trench is relaxed because rearrangement of the silicon atoms increases.

24 Claims, 14 Drawing Sheets

METHOD FOR MANUFACTURING SEMICONDUCTOR DEVICE WITH SEMICONDUCTOR REGION INSERTED INTO TRENCH

CROSS REFERENCE TO RELATED APPLICATION

This application is based upon and claims the benefit of Japanese Patent Application No. 2002-12171 filed on Jan. 21, 2002, the contents of which are incorporated herein by reference.

FIELD OF THE INVENTION

The present invention relates generally to methods for manufacturing a semiconductor device, more particularly for manufacturing a semiconductor device with a semiconductor region inserted into a trench.

BACKGROUND OF THE INVENTION

JP-A-2001-196573 discloses a semiconductor device having a semiconductor region inserted in a trench. Regarding a method for manufacturing a semiconductor device, a first epitaxial layer is grown onto a silicon substrate including the trench by epitaxial growth. A portion of the first epitaxial layer corresponding to an opening of the trench is etched by an HCl gas. Then, a second epitaxial layer is grown onto the first epitaxial layer.

JP-A-2001-274398 discloses a three-dimension power MOSFET in which an N− type drift layer, a P type channel layer and an N+ type source layer (hereinafter referred to as a three-layered configuration) are formed into a trench formed on a silicon substrate. When the configuration disclosed in JP-A-2001-274398 is applied to the method disclosed in JP-A-2001-196573 and the three-layered configuration is formed in the trench, the P type channel layer is liable to form a thin layer at a bottom portion of the trench.

For example, as shown in FIG. 22A, an N− type layer J3 is formed onto the silicon substrate J1 including the trench J2 by epitaxial growth after the trench J2 is formed on the silicon substrate J1. A surface portion of the N− type layer J3 is then removed by HCl gas. Thus, an opening portion of the N− type layer J3 is enlarged as shown in FIG. 22B. The N− type layer J3 is grown again, and a P type layer J4 and an N+ type layer J5 are grown onto the N− type layer J3 as shown in FIG. 22C. Thereafter, the silicon substrate J1 configured above is heated to 1150° C. for 10 minutes. As a result, the three-layered configuration (J3–J5) shown in FIG. 22D is completed. Upon SCM analysis performed on the silicon substrate with the three-layered configuration, a portion of the P type layer (P type channel layer) J4 located at the bottom portion of the trench J2 is transformed into an N type layer. Accordingly, the N+ source layer and the N− type drift layer are electrically connected one another, increasing a leak current when the three-dimensional MOSFET is OFF and decreasing a withstanding voltage of a drain region that approximately equals a withstanding voltage of a source region.

SUMMARY OF THE INVENTION

It is therefore an object of the present invention to provide a method for manufacturing a semiconductor device that is capable of obviating the above problem.

It is another object of the present invention to provide a method for manufacturing a semiconductor device which includes a three-layered structure having a first conductive layer/a second conductive layer/a first conductive layer formed in a trench, to prevent the second conductive layer from being too thin.

It is another object of the present invention to provide a method for manufacturing a semiconductor device having increased reliability relative to a withstanding voltage.

According to a first aspect of the present invention, a portion of a first epitaxial layer formed in a trench in a silicon substrate is removed by vapor phase etching using a halogenated compound or hydrogen. In this removal process, the portion of the first epitaxial layer is removed at a predetermined temperature higher than that during epitaxial growth of the first epitaxial layer and under a predetermined pressure higher than that during epitaxial growth of the first epitaxial layer.

Therefore, stress that would otherwise be concentrated at a bottom portion of the trench is relaxed because rearrangement of the silicon atoms increases. The semiconductor device including a three-layered structure having a first conductive layer/a second conductive layer/a first conductive layer formed in the trench can prevent the second conductive layer from being too thin.

According to a second aspect of the present invention, heating is performed on the semiconductor substrate for relaxing stress that would otherwise be concentrated at a bottom portion of the trench. The heating is performed between the forming of the first epitaxial layer and the forming of the second epitaxial layer. The heating can alternatively be performed after the forming the second epitaxial layer. Accordingly, as mentioned above, stress that would otherwise be concentrated at a bottom portion of the trench is relaxed.

According to a third aspect of the present invention, an ion diffusion layer formed of second conductive type semiconductor is formed at a surface portion of the second epitaxial layer including that in the trench by vapor diffusion. Therefore, stress which is generated if a second conductive type semiconductor layer is formed by epitaxial growth is not applied to a bottom portion of the trench.

According to a fourth aspect of the present invention, corner portions of the trench are rounded by, for example, heat treatment after the portion of the first epitaxial layer is removed. Accordingly, as mentioned above, stress that would otherwise be concentrated at a bottom portion of the trench is relaxed.

According to a fifth aspect of the present invention, the trench is formed in a semiconductor substrate so that an aspect ratio thereof is set at most to 1.6. Therefore, the semiconductor device including a three-layered structure having a first conductive layer/a second conductive layer/a first conductive layer formed in the trench can prevent the second conductive layer from being too thin.

BRIEF DESCRIPTION OF THE DRAWINGS

Other objects, features and advantages of the present invention will be understood more fully from the following detailed description made with reference to the accompanying drawings. In the drawings.

DETAILED DESCRIPTION OF THE PREFERRED EMBODIMENT

Figure 1A:
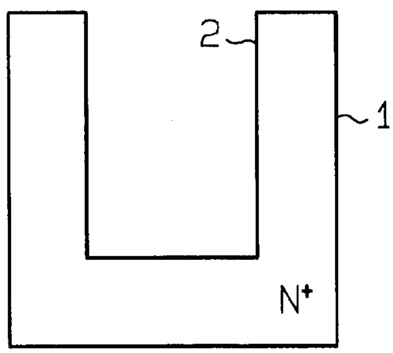
FIGS. 1A to 1C are cross sectional views showing production processes of a semiconductor device according to a first embodiment of the present invention.

The present invention will be described further with reference to various embodiments shown in the drawings.

(First Embodiment)

A semiconductor device of a first embodiment will now be described with reference to FIGS. 1, 2. The semiconductor device corresponds to a three-dimension power MOSFET such as that disclosed in, for example, JP-A-2001-274398, and a manufacturing method thereof will be described in the first embodiment.

Figure 2A:
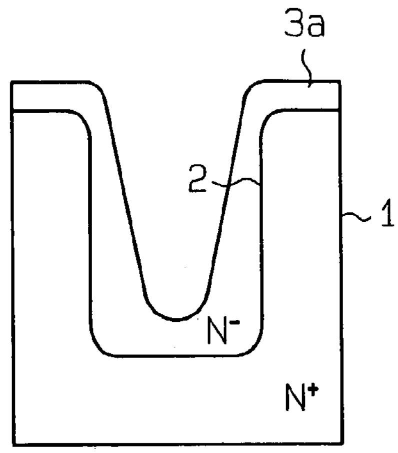
FIGS. 2A to 2C are cross sectional views showing production processes of the semiconductor device following FIG. 1C.
Figure 2B:
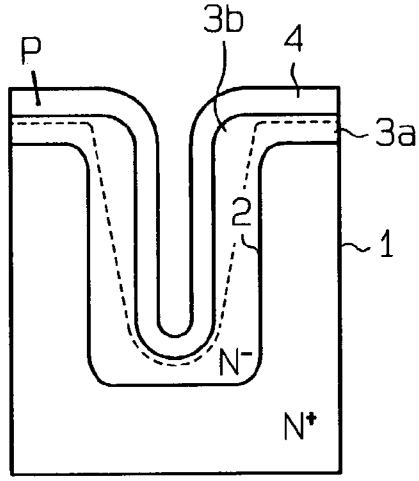
Figure 2C:
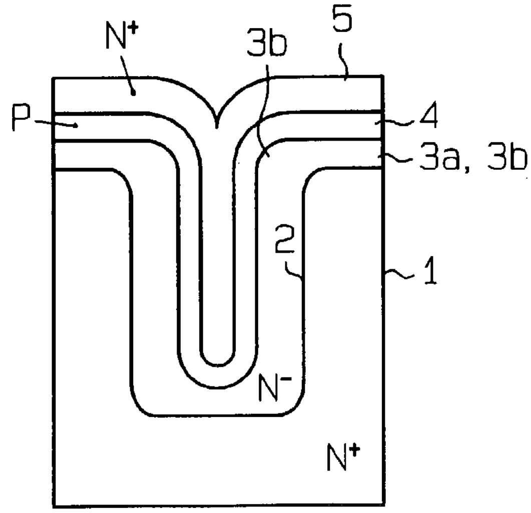

FIG. 2C shows a structure of a three-layered doped region applied to a three-dimension power MOSFET. As shown in FIG. 2C, an N− type silicon layer 3*a*, 3*b* corresponding to a drift layer, a P type silicon layer 4 corresponding to a channel layer and an N+ type silicon layer 5 corresponding to a source layer are disposed on an inner surface of a trench 2 formed in an N+ type silicon substrate 1 corresponding to a drain region.

A manufacturing process will now be described. As shown in FIG. 1A, the trench 2 is formed in a predetermined region of the silicon substrate 1 formed of N+ type single crystal by dry etching or anisotropic wet etching. A silicon oxide layer, a silicon nitride layer or a two-layered configuration formed by a silicon oxide layer and a silicon nitride layer may be used as an etching mask for a trench etching. A silicon oxide layer naturally formed on the silicon substrate 1, the etching mask and a reaction product due to the trench etching are then removed by hydrofluoric acid (HF).

Figure 1B:
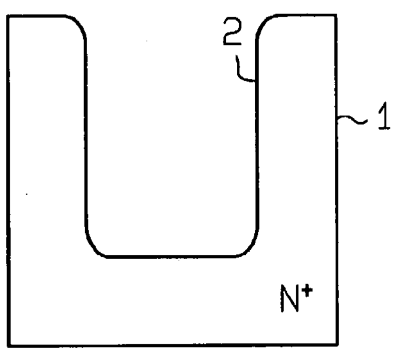
Figure 1C:
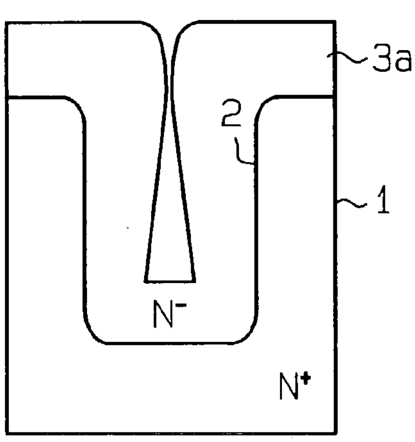

As shown in FIG. 1B, the silicon substrate 1 is inserted in a heat furnace and is heated by an annealing treatment to round corners of a bottom portion and an opening portion of the trench 2 and to remove a surface roughness and crystal defects in the side walls of the trench 2. The N− silicon layer 3*a* is then formed on the silicon substrate 1 including the trench 2 by epitaxial growth.

As shown in FIG. 2A, a part of the silicon layer 3*a* is removed by etching based on vapor phase etching effects of hydrogen chloride (HCl) with an atmospheric gas including HCl. As a result, because a portion of the N− silicon layer 3*a* located on the opening portion of the trench 2 is deeply removed, side walls of the trench 2 are tapered. For example, the etching is conducted by introducing an etching gas into a vacuum atmosphere with a non-oxidizing and non-nitrizing gas (e.g., hydrogen or a noble gas).

In the first embodiment, an LP-CVD apparatus is used to continuously perform the heat treatment, the epitaxial growth and the etching in a significant vacuum chamber thereof Further, the etching in which the etching gas is introduced into the vacuum atmosphere with the non-oxidizing and non-nitrizing gas is performed under a condition as follows.

(1) Etching temperature is defined at not less than a temperature at which the epitaxial growth can be performed, is specifically set at temperature between 850° C. and 1300° C., and is preferably set at temperature between 1100° C. and 1200° C.

(2) A pressure in the vacuum chamber is set to at least a pressure during the epitaxial growth, is specifically set to a pressure between 10 torr and 760 torr (equal to atmospheric pressure), and is preferably set to a pressure between 300 torr and 600 torr.

(3) A flow rate of $H_2$ and/or a noble gas as the non-oxidizing and non-nitrizing gas is set at 10–50 liters per minute.

(4) A flow rate of HCl as the etching gas is set at 1 liter per minute.

In this condition, a stress that would otherwise be concentrated at the bottom portion of the trench 2 is relaxed. A halogenated compound or hydrogen ($H_2$) may alternatively be adapted as an etching gas to remove the part of the silicon layer 3*a* using gas phase etching effects of the halogenated compound or hydrogen.

Successively, as shown in FIG. 2B, the N− type layer 3*b* is formed onto the silicon substrate 1 including the trench 2 by eptaxial growth to cover the N− type silicon layer 3*a*. The P type silicon layer 4 is then formed on the silicon substrate 2 including the trench 2 by eptaxial growth to cover the N− type silicon layer 3*b*. Further, the N+ type silicon layer 5 is formed on the silicon substrate 1 including the trench 2 by eptaxial growth to cover the P type silicon layer 4.

A heat treatment is performed on the silicon substrate 1 to decrease voids formed in the trench 2. Surfaces of the respective layers 3*a*, 3*b*, 4 and 5 are flattened by, for example, etching back, anisotropic wet etching or a combination thereof.

Figure 15A:
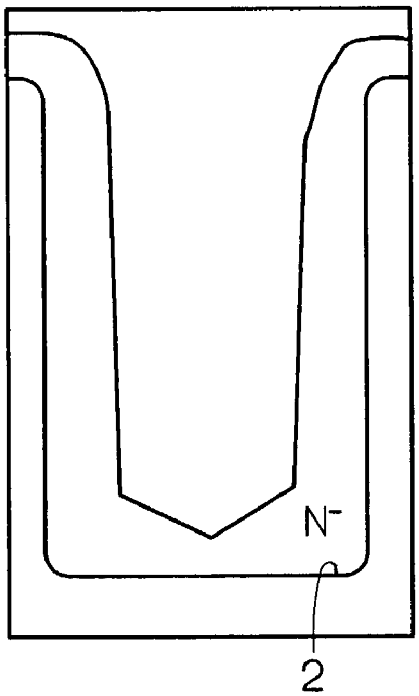
FIGS. 15A and 15B show cross sectional views showing the semiconductor device of the first embodiment and a related art semiconductor device based on SCM analyses.
Figure 15B:
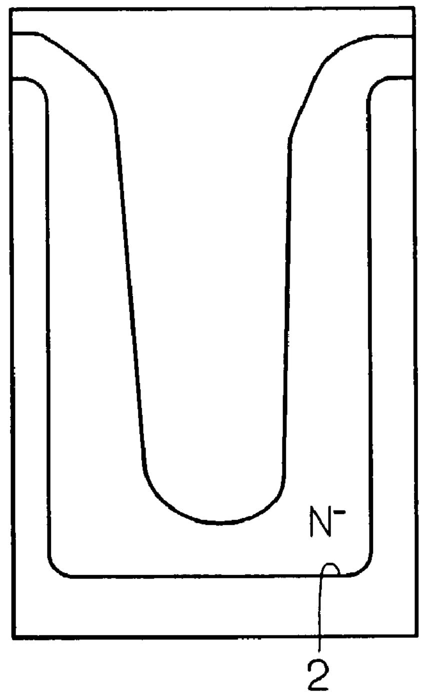

Experimental results will now be described with reference to FIGS. 15–17 and 23. FIGS. 15A and 15B show cross sectional views showing the semiconductor of the first embodiment and a related art semiconductor based on SCM analyses. Specifically, FIGS. 15A and 15B show experimental results in which the pressure in the vacuum chamber is set to pressures of 80 torr and 600 torr, respectively, when the N− type silicon layer 3*a* is etched by HCl under the vacuum atmosphere with the non-oxidizing and non-nitrizing gas. The SCM analyses show that the bottom portion of the trench 2 etched under 600 torr is rounded by moving silicon atoms compared with that etched under 80 torr. This is because a pressure of $H_2$ as the non-oxidizing and non-nitrizing gas under 600 torr is larger than that under 80 torr, and rearrangement of the silicon atoms increases and stress generated around the bottom portion of the trench 2 is automatically relaxed.

Figure 16:
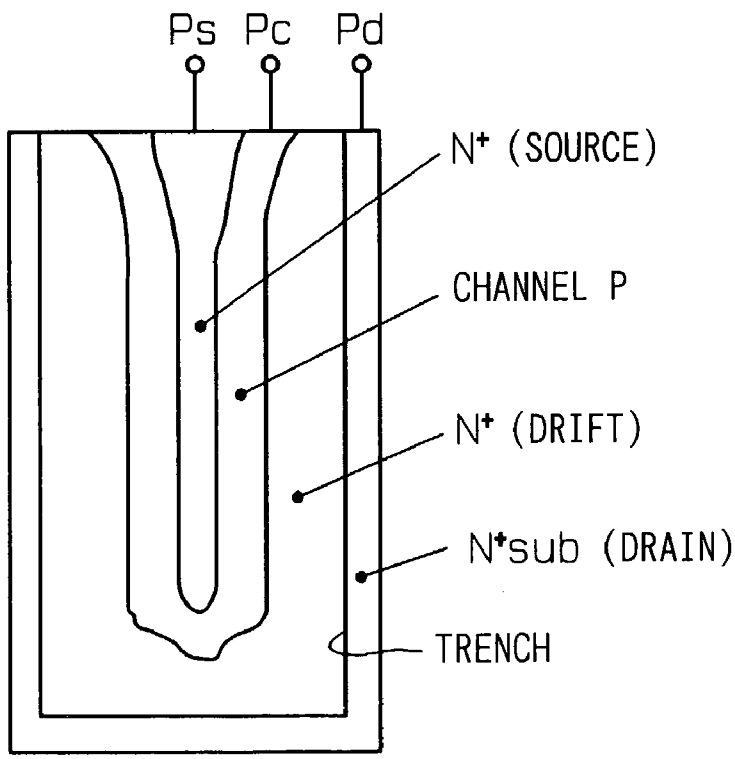
FIG. 16 shows a cross sectional view showing the semiconductor device based on the SCM analysis according to the first embodiment.
Figure 23:
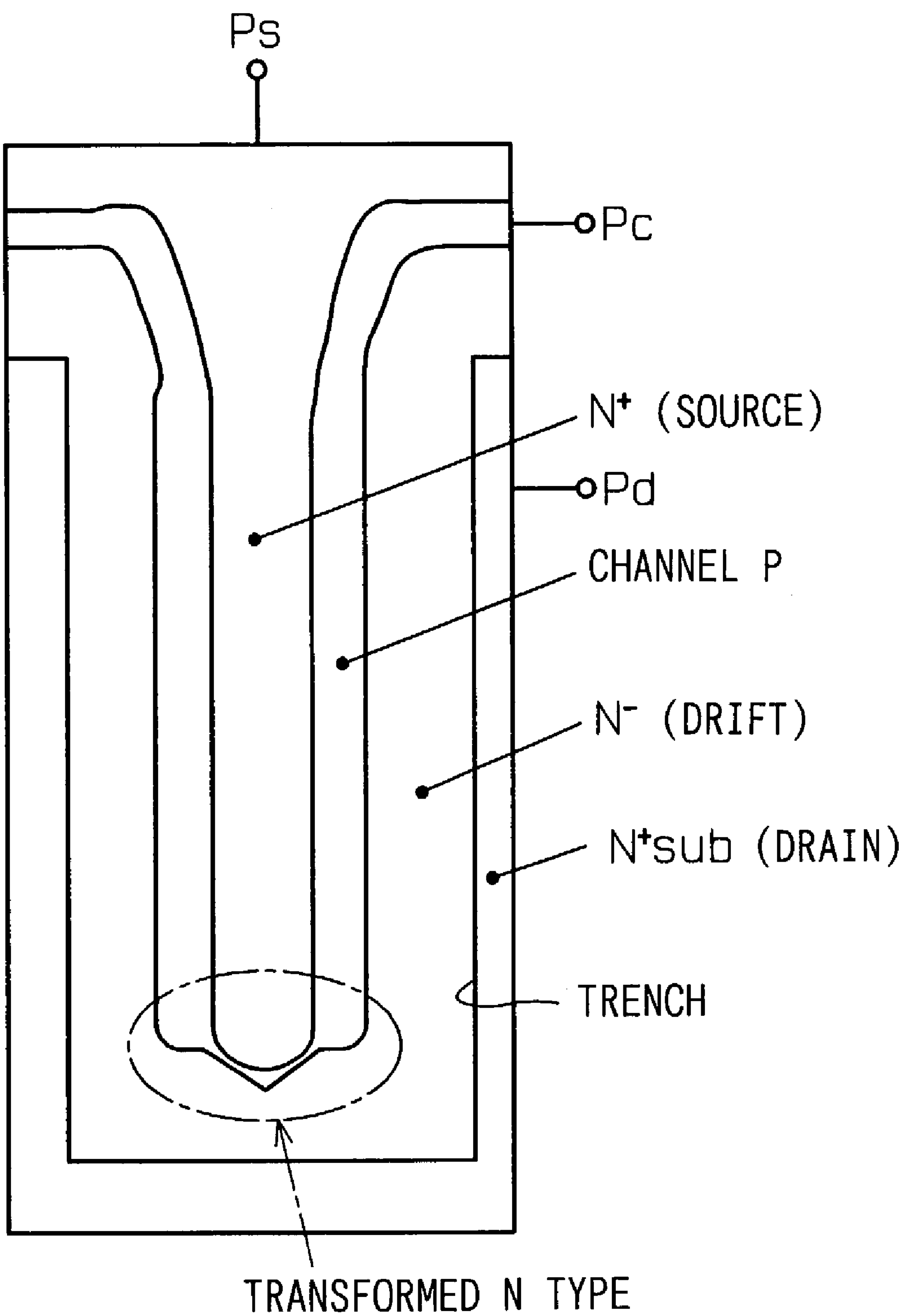
FIG. 23 is a cross sectional view showing the semiconductor device based on the SCM analysis according to the related art semiconductor device.

FIGS. 16 and 23 are cross sectional views showing the semiconductor based on the SCM analyses according to the first embodiment and a related art semiconductor device. Specifically, FIGS. 16 and 23 show experimental results in which the pressure in the vacuum chamber is set to pressures of 600 torr and 80 torr, respectively, when the N− type silicon layer 3*a* (FIG. 1) is etched by HCl under the vacuum atmosphere with the non-oxidizing and non-nitrizing gas, and a three-layered configuration is then formed in the trench 2. The analyses show that the P type silicon layer 4 located at the bottom portion of the trench 2 under 600 torr is restricted to transform into an N type silicon compared with that under 80 torr. This is because the stress generated around the bottom portion of the trench 2 may decrease.

Figure 17:
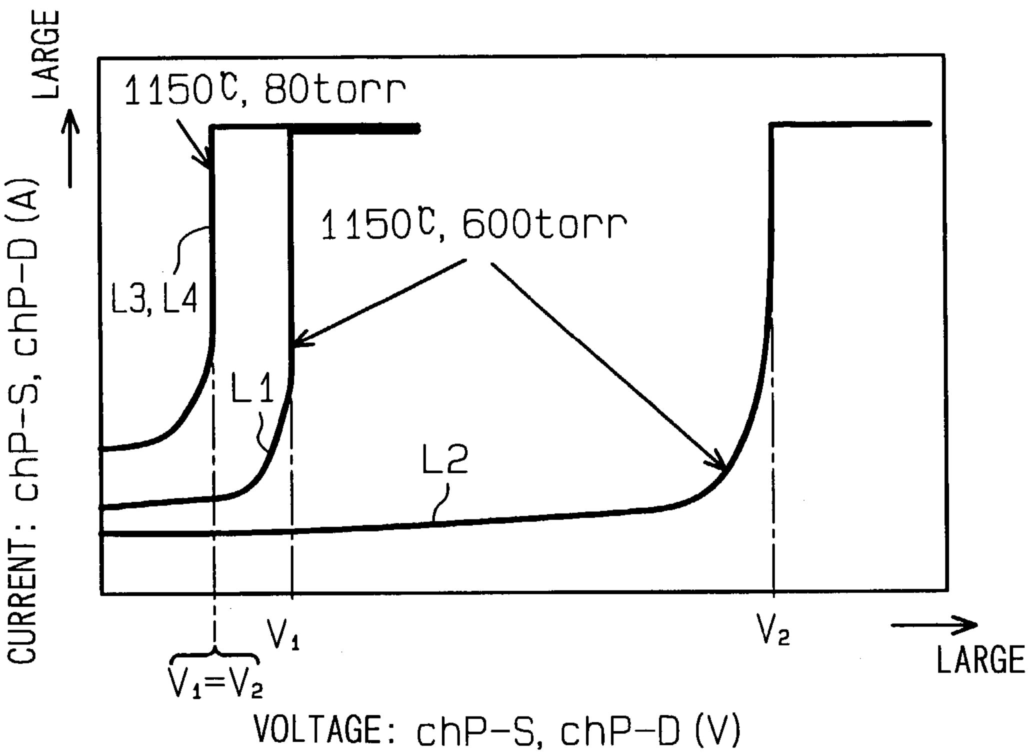
FIG. 17 shows a relationship between a voltage and a current of semiconductor device of the first embodiment and the related art semiconductor.

FIG. 17 shows electrical characteristics of the semiconductor device of the first embodiment and the related art semiconductor device. A solid line L1 corresponds to plots showing I–V characteristics with a reverse bias applied between a channel region and a source region illustrated in FIG. 16 (equal to a portion between Pc and Ps illustrated in FIG. 16) is gradually increased. A solid line L2 corresponds to plots showing I–V characteristics with a reverse bias applied between the channel region and a drain region illustrated in FIG. 16 (equal to a portion between Pc and Pd illustrated in FIG. 16) is gradually increased. A solid line L3 corresponds to plots showing a relationship between a reverse direction current and a voltage when a voltage applied between a channel region and a source region illustrated in FIG. 23 (equal to a portion between Pc and Ps illustrated in FIG. 23) is gradually increased. A solid line L4 corresponds to plots showing a relationship between a reverse direction current and a voltage when a voltage applied between the channel region and a drain region illustrated in FIG. 23 (equal to a portion between Pc and Pd illustrated in FIG. 23) is gradually increased.

As illustrated by the solid lines L3, L4, a withstand voltage V1 between the channel region and the source region equals a withstand voltage V2 between the channel region and the drain region. To the contrary, as illustrated by the solid lines L1, L2, a withstand voltage V1 between the channel region and the source region is different from a withstand voltage V2 between the channel region and the drain region. In other words, regarding P-N diode characteristics, the related art semiconductor device in which the etching is performed under 80 torr is defined so that the withstand voltage V1 equals the withstand voltage V2 (V1=V2), while the semiconductor device of the first embodiment in which the etching is performed under 600 torr is defined so that the withstand voltage V1 does not equal the withstand voltage V2 (V1≠V2). Therefore, in the semiconductor device of the first embodiment, the source region and the drain region (a drift region) are electrically isolated. This shows that the P type silicon layer 4 located at the bottom portion of the trench 2 is restricted to transform into an N type silicon.

According to the above mentioned analyses, when the heat treatment under the vacuum atmosphere with the non-oxidizing and non-nitrizing gas, the stress that would otherwise be concentrated at the bottom portion of the trench 2 is relaxed because rearrangement of the silicon atoms increases. In the heat treatment, the temperature is set at not less than a temperature at which the epitaxial growth can be performed, and a pressure of the non-oxidizing and non-nitrizing gas is set larger than that during the epitaxial growth process. Accordingly, the semiconductor device of the first embodiment can be completed without additional manufacturing equipment as is needed for the related art semiconductor device disclosed in JP-A-2001-274398. The channel region (the P type silicon layer 4) is not enlarged due to ion diffusion caused by high temperature and high pressure of the hydrogen because the heat treatment is performed before the P type silicon layer 4 is formed. Further, the heat treatment can decrease stress and crystal defects.

As mentioned above, in the manufacturing process of the semiconductor device of the first embodiment, the etching of the N− silicon layer 3*a* is performed under conditions in which temperature and pressure are higher than those during formation of the N− silicon layer 3*a*. Therefore, the stress that would otherwise be concentrated at the bottom portion of the trench 2 is relaxed. As a result, a semiconductor device including the three-layered structure having a first conductive layer/a second conductive layer/a first conductive layer formed in a trench can prevent the second conductive layer from being too thin.

(Second Embodiment)

The manufacturing process of a semiconductor device of a second embodiment will now be described with reference to FIGS. 3, 4. In the second embodiment, portions of the manufacturing process different from the first embodiment will be primarily described.

Figure 3A:
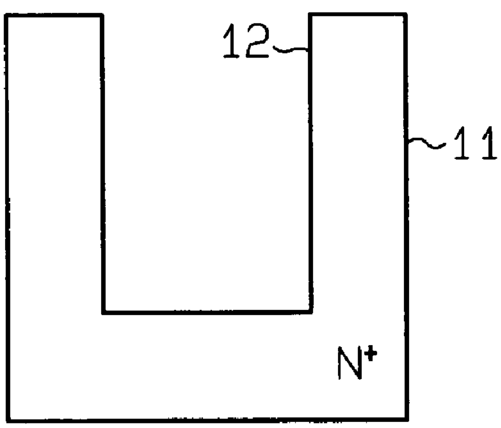
FIGS. 3A to 3D are cross sectional views showing production processes of a semiconductor device according to a second embodiment of the present invention.

As shown in FIG. 3A, a trench 12 is formed in a predetermined region of a silicon substrate 11 formed of an N+ type single crystal. A silicon oxide layer naturally formed on the silicon substrate 11, an etching mask and a reaction product due to the trench etching are then removed by hydrofluoric acid (HF).

Figure 3B:
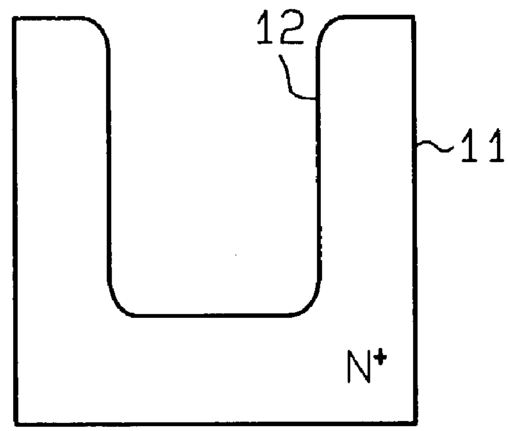
Figure 3C:
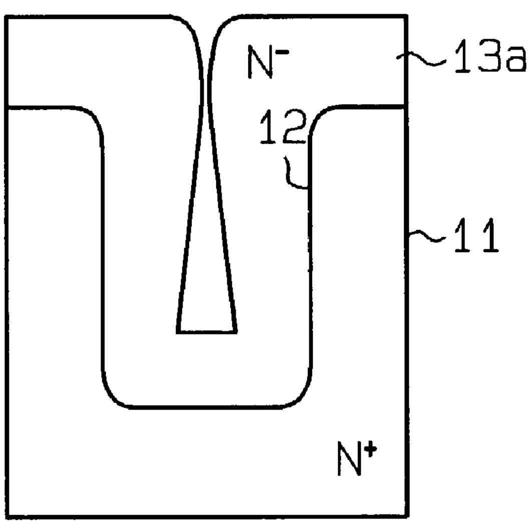

As shown in FIG. 3B, the silicon substrate 11 is inserted in a heat furnace and is heated by an annealing treatment to round corners of a bottom portion and an opening portion of the trench 12 and to remove a surface roughness and crystal defects in the side walls of the trench 12. As shown in FIG. 3C, an N− silicon layer 13*a* is then formed on the silicon substrate 11 including in the trench 12 by epitaxial growth.

Figure 3D:
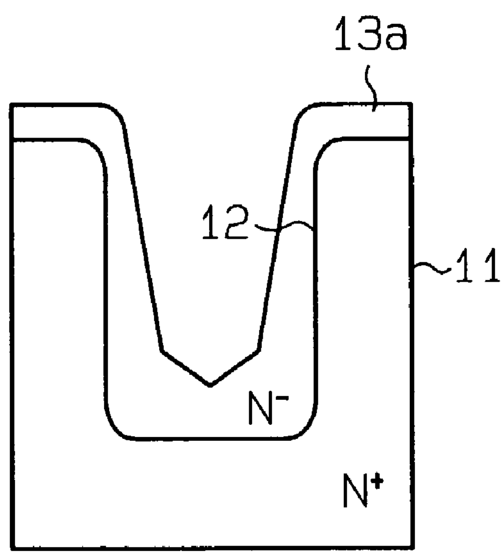

As shown in FIG. 3D, a part of the silicon layer 13*a* is removed by etching based on vapor phase etching effects of hydrogen chloride (HCl) or a halogenated compound with an atmospheric gas including HCl or a halogenated compound. As a result, because a portion of the N− silicon layer 13*a* located on the opening portion of the trench 12 is deeply removed, side walls of the trench 12 are tapered.

Figure 4A:
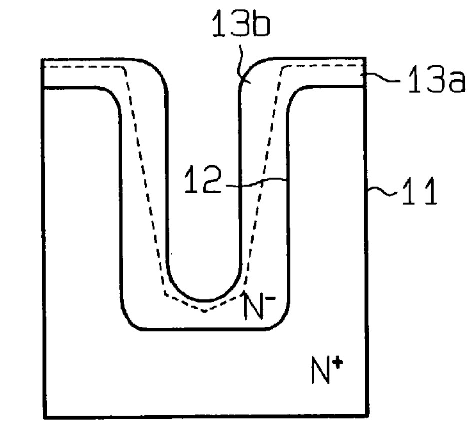
FIGS. 4A to 4C are cross sectional views showing production processes of the semiconductor device following FIG. 3D.

Successively, as shown in FIG. 4A, an N− type layer 13*b* is formed on the silicon substrate 11 including the trench 12 by eptaxial growth to cover the N− type silicon layer 13*a*. A P type silicon layer 14 is then formed on the silicon substrate 12 including the trench 12 by eptaxial growth to cover the N− type silicon layer 13*b*. Further, an N+ type silicon layer 15 is formed on the silicon substrate 11 including the trench 12 by eptaxial growth to cover the P type silicon layer 14.

A heat treatment is performed on the silicon substrate 11 to decrease voids formed in the trench 12. Surfaces of the respective layers 13*a*, 13*b*, 14 and 15 are flattened.

Figure 4B:
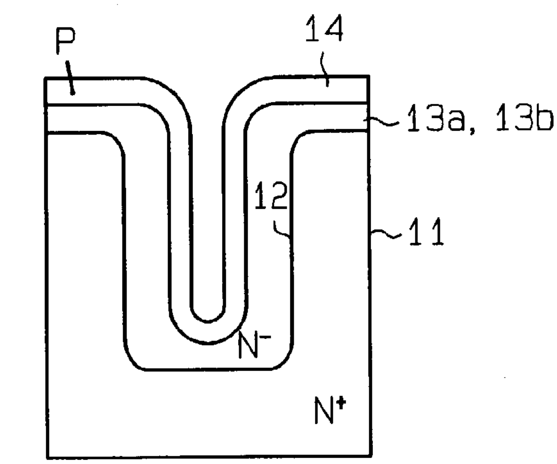
Figure 4C:
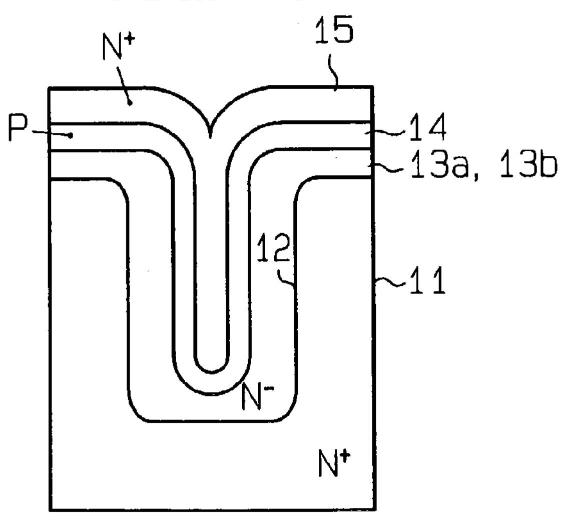

In the second embodiment, an annealing treatment under an atmospheric gas with a non-oxidizing and non-nitrizing gas is performed before the P type silicon layer 14 illustrated in FIG. 4B is formed under a condition as follows.

(1) An annealing temperature is defined at not less than temperature at which the epitaxial growth can be performed, is specifically set at temperature between 850° C. and 1300° C., and is preferably set at temperature between 1100° C. and 1200° C.

(2) A pressure in the vacuum chamber is set to at least a pressure during the epitaxial growth, is specifically set to a pressure between 10 torr and 760 torr (equal to to atmospheric pressure), and is preferably set to a pressure between 300 torr and 600 torr.

(3) $H_2$ and/or a noble gas is used as the non-oxidizing and non-nitrizing gas.

In this condition, stress that would otherwise be concentrated at the bottom portion of the trench 12 is relaxed.

As mentioned above, in the manufacturing process of the semiconductor device of the second embodiment, the annealing treatment (heat treatment) is performed on the N− silicon layers 13*a*, 13*b* after the part of the N− silicon layer 13*a* is removed and the N− silicon layer 13*b* is formed. Therefore, the stress that would otherwise be concentrated at the bottom portion of the trench 12 is relaxed. As a result, a semiconductor device including the three-layered structure having a first conductive layer/a second conductive layer/a first conductive layer formed in a trench can prevent the second conductive layer from being too thin.

(Third Embodiment)

The manufacturing processes of a semiconductor device of a third embodiment will now be described with reference to FIGS. 5, 6. In the third embodiment, portions of the manufacturing processes different from the first embodiment will be primarily described.

Figure 5A:
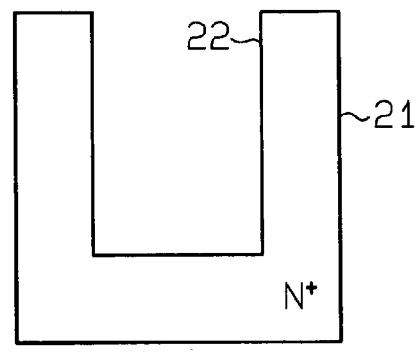
FIGS. 5A to 5C are cross sectional views showing production processes of a semiconductor device according to a third embodiment of the present invention.

As shown in FIG. 5A, a trench 22 is formed in a predetermined region of a silicon substrate 21 formed of N+ type single crystal. A silicon oxide layer naturally formed on the silicon substrate 21, an etching mask and a reaction product due to the trench etching are then removed by hydrofluoric acid (HF).

Figure 5B:
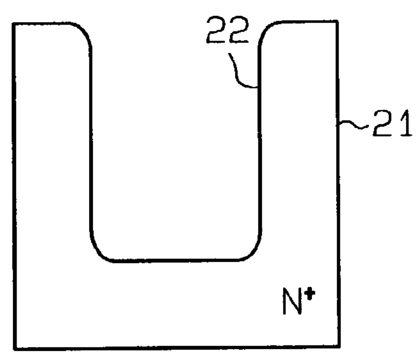
Figure 5C:
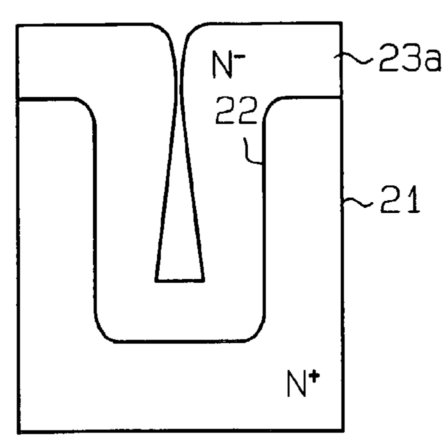

As shown in FIG. 5B, the silicon substrate 21 is inserted in a heat furnace and is heated by an annealing treatment to round corners of a bottom portion and an opening portion of the trench 22 and to remove a surface roughness and crystal defects in the side walls of the trench 22. As shown in FIG. 5C, an N− silicon layer 23*a* is then formed on the silicon substrate 21 including in the trench 22 by epitaxial growth.

Figure 6A:
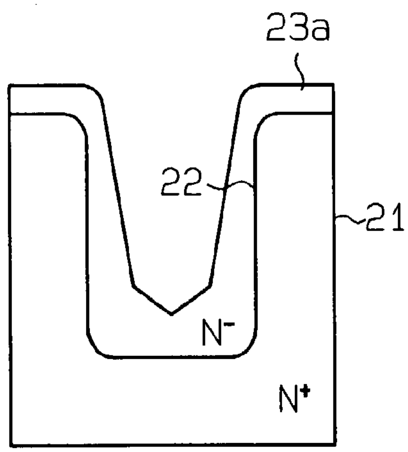
FIGS. 6A to 6C are cross sectional views showing production processes of the semiconductor device following FIG. 5C.

As shown in FIG. 6A, a part of the silicon layer 23*a* is removed by etching based on vapor phase etching effects of hydrogen chloride (HCl) or a halogenated compound with an atmospheric gas including HCl or a halogenated compound. As a result, because a portion of the N− silicon layer 23*a* located on the opening portion of the trench 22 is deeply removed, side walls of the trench 22 are tapered.

Figure 6B:
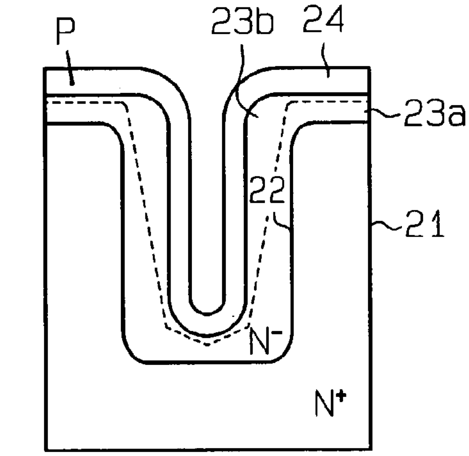

Successively, as shown in FIG. 6B, an N− type layer 23*b* is formed on the silicon substrate 21 including the trench 22 by eptaxial growth to cover the N− type silicon layer 23*a*. A P type silicon layer 24 is then formed on the silicon substrate 22 including the trench 22 by eptaxial growth to cover the N− type silicon layer 23*b*.

In the third embodiment, a formation process of the P type silicon layer 24 and an annealing treatment under an atmospheric gas with a non-oxidizing and non-nitrizing gas are repeatedly performed several times. That is, the annealing treatment is performed after the formation process of the P type silicon layer 24 is partially completed, and the rest of the forming process of the P type silicon layer 24 is performed after the annealing treatment.

The formation process of the P type silicon layer 24 and the annealing treatment are performed under conditions as follows.

(1) Epitaxial growth temperature of the P type silicon layer 24 is set at temperature between 800° C. and 950° C. Annealing temperature is set at temperature between 850° C. and 1300° C., and is preferably set at temperature between 1100° C. and 1200° C.

(2) A pressure in the vacuum chamber is set to a pressure between 1 torr and 100 torr during epitaxial growth, is set to a pressure between 1 torr and 760 torr (equal to atmospheric pressure) during the annealing treatment, and is preferably set to a pressure between 300 torr and 600 torr during the annealing treatment.

(3) $SiH_4$, $SiH_2Cl_2$, $SiHCl_3$ or $SiCl_4$ is used as a material gas during the epitaxial growth. $H_2$ or a noble gas is used as the non-oxidizing and non-nitrizing gas during the annealing treatment.

According to the manufacturing process, the annealing treatment is performed while during the P type silicon layer 24 is formed. In this condition, stress that would otherwise be concentrated at the bottom portion of the trench 22 is relaxed.

Figure 6C:
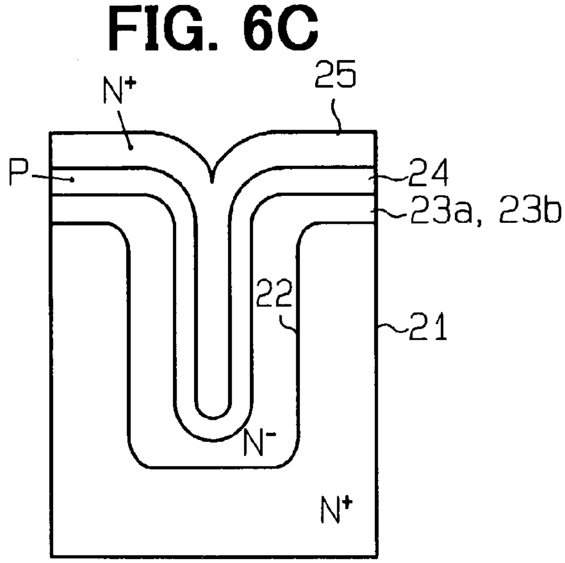

Further, as shown in FIG. 6C, an N+ type silicon layer 25 is formed onto the silicon substrate 21 including the trench 22 by eptaxial growth to cover the P type silicon layer 24. A heat treatment is performed on the silicon substrate 21 to decrease voids formed in the trench 22. Surfaces of the respective layers 23*a*, 23*b*, 24 and 25 are flattened.

As mentioned above, in the manufacturing process of the semiconductor device of the third embodiment, the annealing treatment (heat treatment) is performed on the silicon layers 23*a*, 23*b* and 24. Therefore, the stress that would otherwise be concentrated at the bottom portion of the trench 22 is relaxed. As a result, a semiconductor device including the three-layered configuration having a first conductive layer/a second conductive layer/a first conductive layer formed in a trench can prevent the second conductive layer from being too thin.

A formation process of the P type silicon layer 24 is divided into several portions, and the annealing process is performed after each portion of the formation process of the P type silicon layer 24. Therefore, since the silicon layers 23–25 can more appropriately be filled in the trench 22, voids in the filled epitaxial layer caused when the silicon layers 23–25 are not filled in the trench 22 can be prevented.

(Fourth Embodiment)

The manufacturing process of a semiconductor device of a fourth embodiment will now be described with reference to FIGS. 7, 8. In the fourth embodiment, portions of the manufacturing process different from the first embodiment will be primarily described.

Figure 7A:
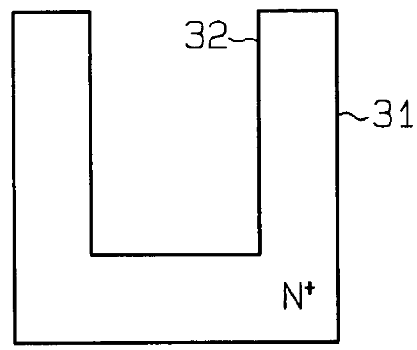
FIGS. 7A to 7C are cross sectional views showing production processes of a semiconductor device according to a fourth embodiment of the present invention.

As shown in FIG. 7A, a trench 32 is formed in a predetermined region of a silicon substrate 31 formed of N+ type single crystal. A silicon oxide layer naturally formed on the silicon substrate 31, an etching mask and a reaction product due to the trench etching are then removed by hydrofluoric acid (HF).

Figure 7B:
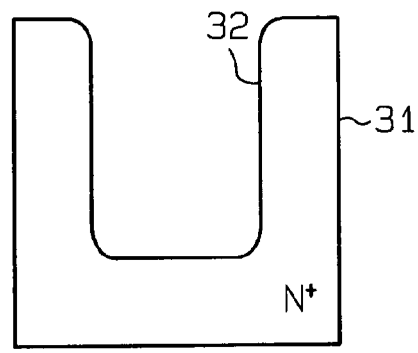
Figure 7C:
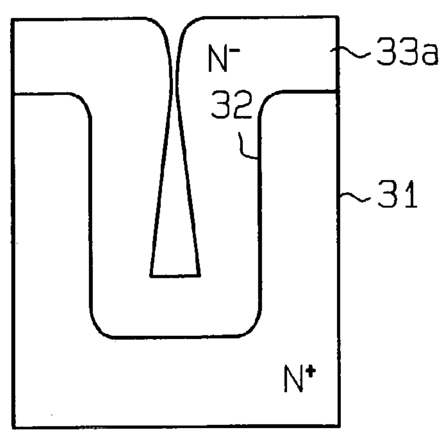

As shown in FIG. 7B, the silicon substrate 31 is inserted in a heat furnace and is heated by an annealing treatment to round corners of a bottom portion and an opening portion of the trench 32 and to remove a surface roughness and crystal defects in the side walls of the trench 32. As shown in FIG. 7C, an N− silicon layer 33*a* is then formed on the silicon substrate 31 including in the trench 32 by epitaxial growth.

Figure 8A:
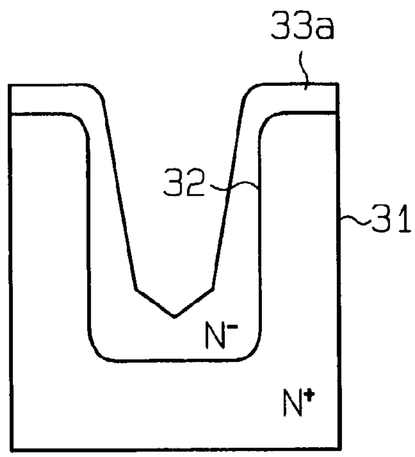
FIGS. 8A to 8C are cross sectional views showing production processes of the semiconductor device following FIG. 7C.

As shown in FIG. 8A, a part of the silicon layer 33*a* is removed by etching based on vapor phase etching effects of hydrogen chloride (HCl) or a halogenated compound with an atmospheric gas including HCl or a halogenated compound. As a result, because a portion of the N− silicon layer 33*a* located on the opening portion of the trench 32 is deeply removed, side walls of the trench 32 are tapered.

Figure 8B:
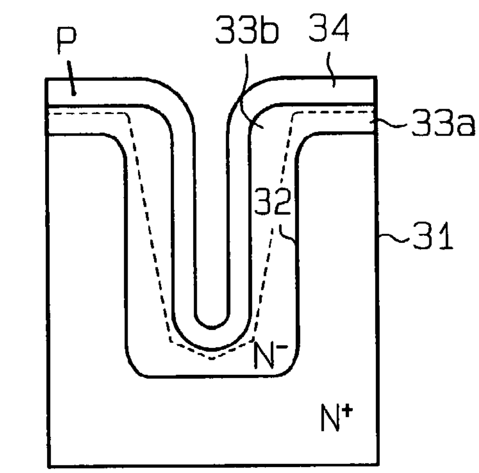

Successively, as shown in FIG. 8B, an N− type layer 33*b* is formed on the silicon substrate 31 including the trench 32 by eptaxial growth to cover the N− type silicon layer 33*a*.

A P type silicon layer 34 is then formed on a surface region of the N− type silicon layers 33*a*, 33*b* by vapor diffusion. The P type silicon layer 34 is formed during heat treatment under an atmospheric gas with a non-oxidizing and non-nitrizing gas and with $B_2H_6$ being introduced as a doping gas. Specifically, the formation process of the P type silicon layer 34 is performed under the following conditions.

(1) A temperature of the heat treatment is defined at not less than a temperature at which the epitaxial growth can be performed, is specifically set at temperature between 850° C. and 1300° C., and is preferably set at temperature between 1100° C. and 1200° C.

(2) A pressure in the vacuum chamber is set to at least a pressure during the epitaxial growth, is specifically set to a pressure between 10 torr and 760 torr (equals to atmosphere pressure), and is preferably set to a pressure between 300 torr and 600 torr.

(3) $H_2$ and/or a noble gas is used as the non-oxidizing and non-nitrizing gas.

(4) $B_2H_6$ as the doping gas is diluted with $H_2$.

Figure 8C:
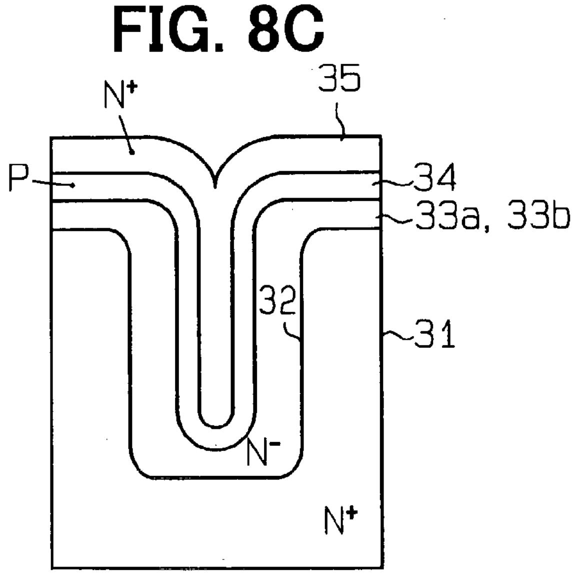

Further, as shown in FIG. 8C, an N+ type silicon layer 35 is formed on the silicon substrate 31 including the trench 32 by eptaxial growth to cover the P type silicon layer 34. Heat treatment is performed on the silicon substrate 31 to decrease voids formed in the trench 32. Surfaces of the respective layers 33*a*, 33*b*, 34 and 35 are flattened.

According to the manufacturing processes of the fourth embodiment, the P type silicon layer 34 is formed by heat treatment under an atmospheric gas with $B_2H_6$ after the N− type silicon layers 33*a*, 33*b* are formed. In this heat treatment, the $B_2H_6$ gas is mixed in $H_2$ (and/or a noble gas) used as a carrier gas, and a pressure in the vacuum chamber in which an atmospheric gas including the $B_2H_6$ and $H_2$ is introduced is decreased. Temperature of the heat treatment is set at more than 1000° C. (more preferably 1100° C.) to increase automatic stress relaxation due to rearrangement of silicon atoms though boron (B) ions can be diffused at more than 800° C.

Figure 18:
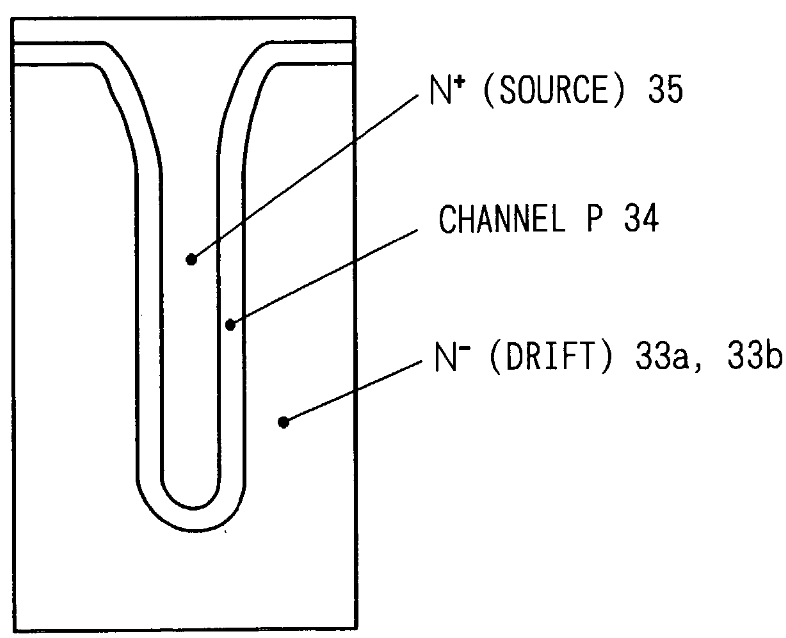
FIG. 18 shows a cross sectional view showing the semiconductor device based on the SCM analysis according to the fourth embodiment.

FIG. 18 is a cross sectional view showing the semiconductor device, to which a heat treatment at 1150° C. is performed for 10 minutes after the silicon layers 33*a*, 33*b*, 34 and 35 are formed, based on the SCM analysis. A thickness of the P type layer 34 is uniform from portions on side walls of the trench 32 to a portion on a bottom portion of the trench 32. This is because the stress relaxation due to rearrangement of silicon atoms increases by the annealing treatment using $B_2H_6$ gas at high temperature and with high hydrogen pressure, and therefore the stress generated around the bottom portion of the trench 32 may decrease.

According to the above mentioned manufacturing process of the fourth embodiment, the P type silicon layer 34 is formed in N− type silicon layers 33*a*, 33*b* by vapor phase diffusion with the heat treatment under the non-oxidizing and non-nitrizing gas (pressure decreased atmospheric gas) using $B_2H_6$. The vapor phase diffusion process also acts as heat treatment under the non-oxidizing and non-nitrizing gas so that rearrangement of the silicon atoms in a portion of silicon layers 33*a*, 33*b* and 34, at which stress is concentrated, increases and stress generated around the bottom portion of the trench 32 is relaxed. Temperature during the diffusion process is set to a temperature higher than that during epitaxial growth, and a pressure of the non-oxidizing and non-nitrizing gas is set to a pressure higher than that during epitaxial growth. Therefore, the semiconductor device of the fourth embodiment can be completed without additional manufacturing equipment and can decrease stress and crystalline defects with respect to the related art semiconductor device disclosed in JP-A-2001-274398.

As mentioned above, the P type silicon layer 34 is formed in the surface region of the N− type silicon layer 33*a*, 33*b* by vapor diffusion. Therefore, stress which is generated if the P type silicon layer 34 is formed by epitaxial growth is not applied to a bottom portion of the trench 32. As a result, a semiconductor device including the three-layered structure having a first conductive layer/a second conductive layer/a first conductive layer formed in a trench can prevent the second conductive layer from being too thin. In addition, when the vapor diffusion process in which the P type silicon layer 34 is formed is performed at 1000° C. or more, and more preferably performed at 1100° C. or more, stress is effectively relaxed by the heat treatment.

(Fifth Embodiment)

The manufacturing process of a semiconductor device of a fifth embodiment will now-be described with reference to FIGS. 9, 10. In the fifth embodiment, portions of the manufacturing process different from the first embodiment will be primarily described.

Figure 9A:
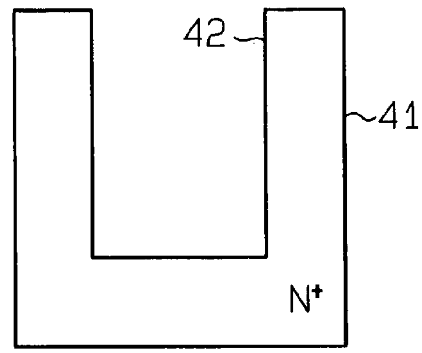
FIGS. 9A to 9C are cross sectional views showing production processes of a semiconductor device according to a fifth embodiment of the present invention.

As shown in FIG. 9A, a trench 42 is formed in a predetermined region of a silicon substrate 41 formed of N+ type single crystal. A silicon oxide layer naturally formed on the silicon substrate 41, an etching mask and a reaction product due to the trench etching are then removed by hydrofluoric acid (HF).

Figure 9B:
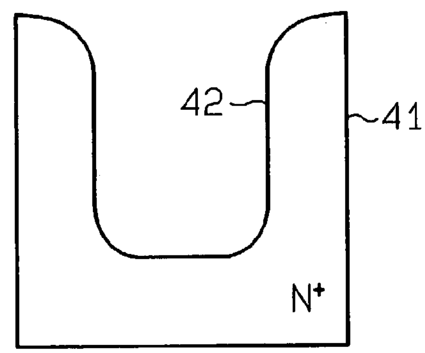
Figure 9C:
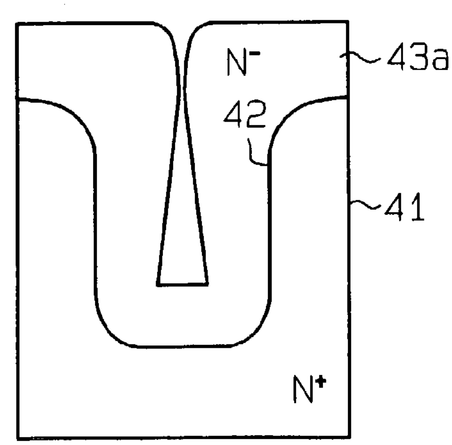

As shown in FIG. 9B, the silicon substrate 41 is inserted in a heat furnace and is heated by an annealing treatment to round corners of a bottom portion and an opening portion of the trench 42 to remove surface roughness and crystal defects in the side walls of the trench 42. As shown in FIG.

9C, an N− silicon layer 43*a* is then formed on the silicon substrate 41 including in the trench 42 by epitaxial growth.

Figure 10A:
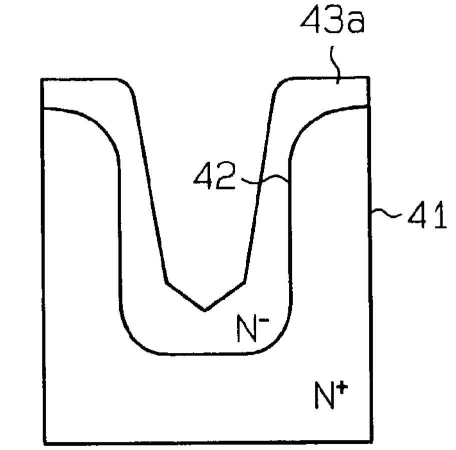
FIGS. 10A to 10C are cross sectional views showing production processes of the semiconductor device following FIG. 9C.

As shown in FIG. 10A, a part of the silicon layer 43*a* is removed by etching based on vapor phase etching effects of hydrogen chloride (HCl) or a halogenated compound with an atmospheric gas including HCl or a halogenated compound. As a result, because a portion of the N− silicon layer 43*a* located on the opening portion of the trench 42 is deeply removed, side walls of the trench 42 are tapered.

Figure 10B:
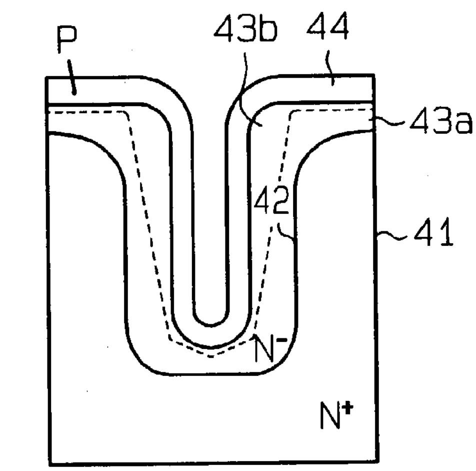

Successively, as shown in FIG. 10B, an N− type layer 43*b* is formed onto the silicon substrate 41 including the trench 42 by eptaxial growth to cover the N− type silicon layer 43*a*. A P type silicon layer 44 is then formed on the silicon substrate 42 including the trench 42 by eptaxial growth to cover the N− type silicon layer 43*b*.

Figure 10C:
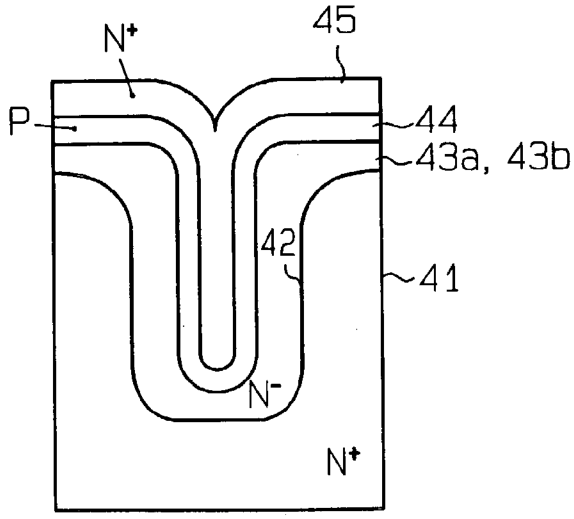

Further, as shown in FIG. 10C an N+ type silicon layer 45 is formed onto the silicon substrate 41 including the trench 42 by eptaxial growth to cover the P type silicon layer 44. Heat treatment is performed to the silicon substrate 41 to decrease voids formed in the trench 42. Surfaces of the respective layers 43*a*, 43*b*, 44 and 45 are flattened.

In the fifth embodiment, an annealing treatment under an atmospheric gas with a non-oxidizing and non-nitrizing gas is performed during rounding of the bottom portion and the opening portion of the trench 42 as shown in FIG. 9B. The annealing treatment is performed in an identical chamber in which epitaxial growth of the respective silicon layers 43*a*, 43*b*, 44 and 45 is formed under conditions as follows.

(1) Temperature of the annealing treatment is defined at not less than temperature at which the epitaxial growth can be performed, is specifically set at temperature between 850° C. and 1300° C., and is preferably set at temperature between 1100° C. and 1200° C.

(2) A pressure in the vacuum chamber (degree of vacuum) is set to at least a pressure during the epitaxial growth, is specifically set to a pressure between 10 torr and 760 torr (equals to atmosphere pressure), and is preferably set to a pressure between 300 torr and 600 torr.

(3) A flow rate of $H_2$ or/and a noble gas as athe non-oxidizing and non-nitrizing gas is set in 10–50 liters per minute.

Under those conditions, a stress that would otherwise be concentrated at the bottom portion of the trench 2 is relaxed.

Figure 19:
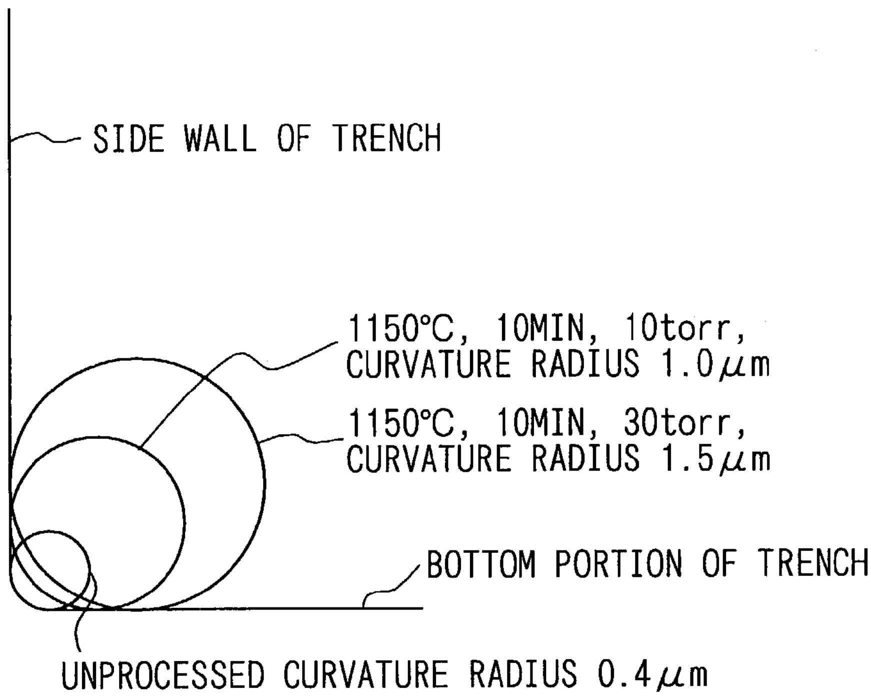
FIG. 19 shows a relationship between a pressure during heat treating and a curvature radius of a trench according to fifth embodiment.

According to the manufacture processes, the silicon substrate 41 is inserted in a vacuum chamber of an LP-CVD apparatus after the oxide layer naturally formed on the silicon substrate 41 is removed. Then, corners of the bottom portion of the trench 42 are rounded in the chamber of the LP-CD apparatus by an annealing treatment (heat treatment) with an atmospheric gas including the non-oxidizing and non-nitrizing gas (specifically, $H_2$ is introduced) before the silicon layers 43*a*, 43*b*, 44 and 45 is formed. Therefore, the rounding treatment of the corners decreases stress because the stress generated at the bottom portion of the trench 42 may be concentrated in the corners at which plural epitaxial layers are grown on surfaces of silicon having different planar directions. The annealing treatment is performed at a temperature during epitaxial growth (e.g., 850° C.) for moving silicon atoms, is preferably set at 1100° C. or more. A pressure of $H_2$ is set high for effectively removing an oxide layer that is formed on a surface of the silicon substrate 41 and restricts movement of the silicon atoms. The degree of vacuum is set to at least a pressure during the epitaxial growth (e.g., 80 torr or more), and is preferably set to a pressure between 200 torr and atmospheric pressure. As a result, as shown in FIG. 19, radii of the corners after the annealing treatment are larger than before the annealing treatment so that the corners are rounded.

Incidentally, when an additional annealing treatment is performed before the P type silicon layer 44 is formed, crystalline defects of the semiconductor device are decreased and electrical field concentrations are restricted as well as stress because the corners of the trench 42 are rounded.

As mentioned above, the corners of the trench 42 are rounded after the trench 42 is formed in the silicon substrate 41. Therefore, the stress that would otherwise be concentrated at the bottom portion of the trench 42 is relaxed based on a shape of the trench 42. As a result, a semiconductor device including the three-layered configuration having a first conductive layer/a second conductive layer/a first conductive layer formed in a trench can prevent the second conductive layer from being too thin.

(Sixth Embodiment)

The manufacturing process of a semiconductor device of a sixth embodiment will now be described with reference to FIGS. 11, 12. In the sixth embodiment, portions of the manufacturing process different from the first embodiment will be primarily are described.

Figure 11A:
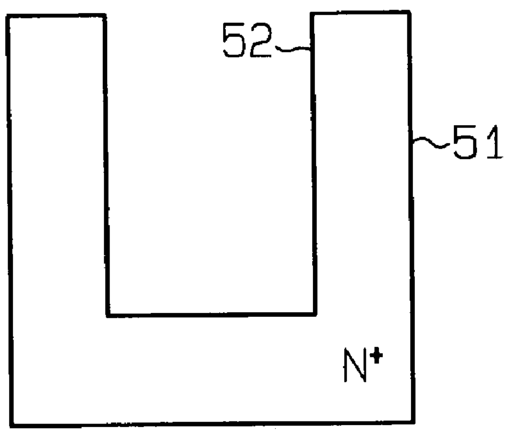
FIGS. 11A to 11D are cross sectional views showing production processes of a semiconductor device according to a sixth embodiment of the present invention.

As shown in FIG. 11A, a trench 52 is formed in a predetermined region of a silicon substrate 51 formed of N+ type single crystal. A silicon oxide layer naturally formed on the silicon substrate 51, an etching mask and a reaction product due to the trench etching are then removed by hydrofluoric acid (HF).

Figure 11B:
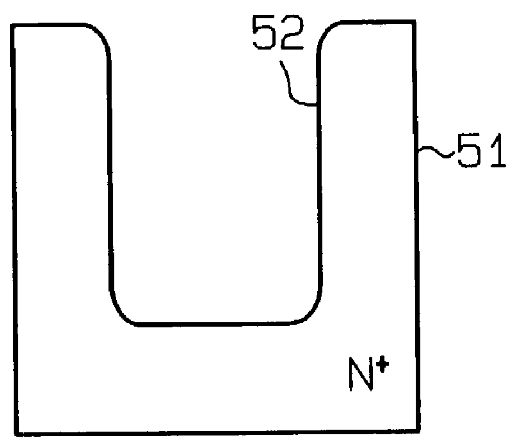
Figure 11C:
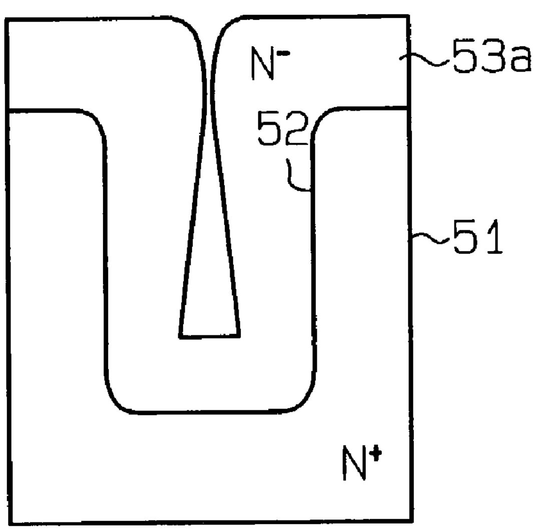

As shown in FIG. 11B, the silicon substrate 51 is inserted in a heat furnace and is heated by an annealing treatment to round corners of a bottom portion and an opening portion of the trench 52 and to remove a surface roughness and crystal defects in the side walls of the trench 52. As shown in FIG. 11C, an N− silicon layer 53*a* is then formed on the silicon substrate 51 including the trench 52 by epitaxial growth.

Figure 11D:
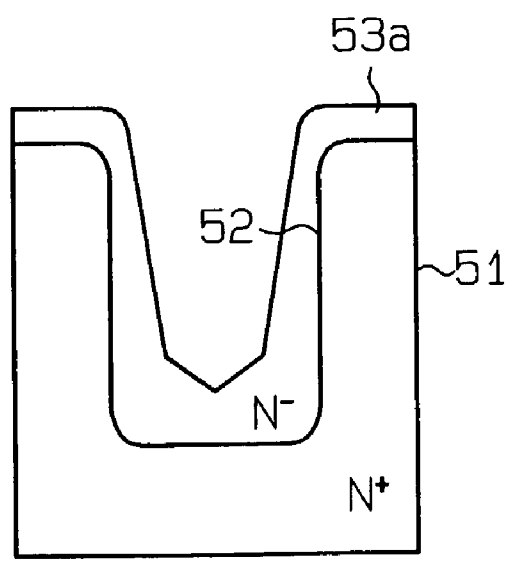

As shown in FIG. 11D, a part of the silicon layer 53*a* is removed by etching based on vapor phase etching effect of hydrogen chloride (HCl) or a halogenated compound with an atmospheric gas including HCl or a halogenated compound. As a result, because a portion of the N− silicon layer 53*a* located on the opening portion of the trench 52 is deeply removed, side walls of the trench 52 are tapered.

Figure 12A:
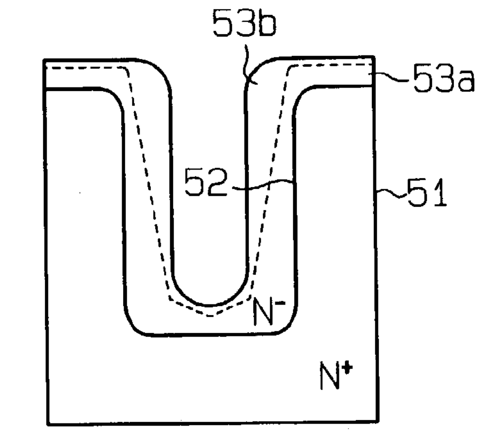
FIGS. 12A to 12C are cross sectional views showing production processes of the semiconductor device following FIG. 11D.
Figure 12B:
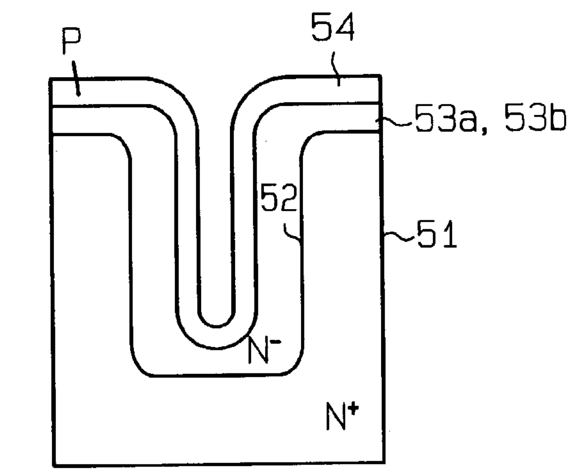

Successively, as shown in FIG. 12A, an N− type layer 53*b* is formed on the silicon substrate 51 including the trench 52 by epitaxial growth to cover the N− type silicon layer 53*a*. As shown in FIG. 12B, a P type silicon layer 54 is then formed on the silicon substrate 52 including the trench 52 by eptaxial growth to cover the N− type silicon layer 53*b*.

Figure 12C:
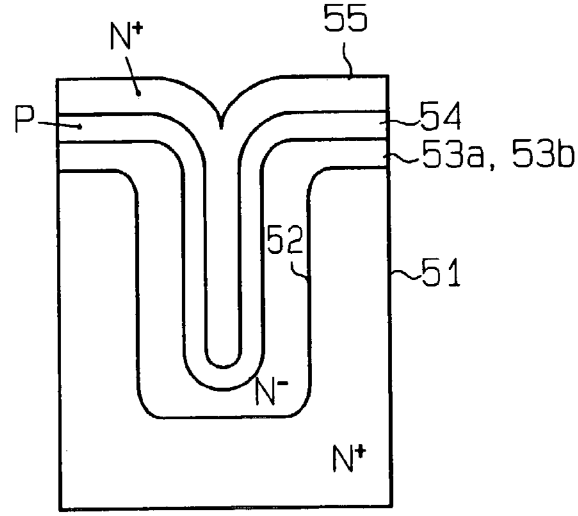

Further, as shown in FIG. 12C, an N+ type silicon layer 55 is formed on the silicon substrate 51 including the trench 52 by eptaxial growth to cover the P type silicon layer 54. A heat treatment is performed on the silicon substrate 51 to decrease voids formed in the trench 52. Surfaces of the respective layers 53*a*, 53*b*, 54 and 55 are flattened.

In the sixth embodiment, a shape of the trench 52 is changed during the aforementioned process so that stress that would otherwise be concentrated at the bottom portion of the trench 52 is relaxed based on a shape of the trench 52. In addition, the shape of the trench 52 is further changed during a second process after the part of the N− type silicon layer 53*b* is etched as illustrated in FIG. 11D.

Specifically, in the first process, corners of the trench 52 are rounded by isotropic etching using, for example, nitric-fluoric acid or CDE after the trench 52 is formed by etching illustrated in FIG. 11A. The corners of the trench 52 can alternatively be rounded by removing a thermal oxide layer after a surface of the silicon substrate 51 including inside walls of the trench 52 is sacrificially oxidized.

In the second process, to change the shape of the corners of the trench 52 (the N− type silicon layer 53a), the silicon substrate 51 is etched by isotropic etching using, for example, nitric-fluoric acid or CDE after the silicon substrate 51 is etched by HCl or the like illustrated in FIG. 11D. In the second process, the corners of the trench 52 can alternatively be rounded by removing a thermal oxide layer after a surface of the silicon substrate 51 including inside walls of the trench 52 is sacrificially oxidized. The corners of the trench 52 can alternatively be rounded by an annealing treatment (heat treatment).

As mentioned above, the corners of the trench 52 are rounded after the trench 52 is formed in the silicon substrate 51 and after the part of the N− type silicon layer 53a is etched. Therefore, the stress that would otherwise be concentrated at the bottom portion of the trench 52 is relaxed based on a shape of the trench 52. As a result, a semiconductor device including the three-layered configuration having a first conductive layer/a second conductive layer/a first conductive layer formed in a trench can prevent the second conductive layer from being too thin.

(Seventh Embodiment)

The manufacturing process of a semiconductor device of a seventh embodiment will now be described with reference to FIGS. 13, 14. In the seventh embodiment, portions of the manufacturing process different from the first embodiment will be primarily described.

Figure 13A:
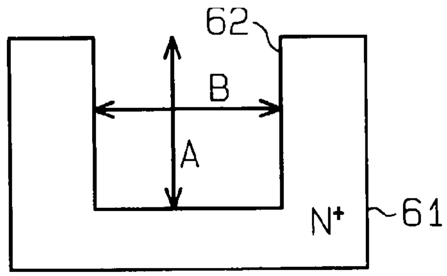
FIGS. 13A to 13D are cross sectional views showing production processes of a semiconductor device according to a seventh embodiment of the present invention.

As shown in FIG. 13A, a trench 62 is formed in a predetermined region of a silicon substrate 61 formed of N+ type single crystal so that an aspect ratio of the trench 62, which is defined as a ratio A/B, where A is a depth of the trench 62 and B is a width of the trench 62, is low. Specifically, the aspect ratio of the trench 62 is set to a value between 0.2 and 1.6. According to the seventh embodiment, a P type silicon layer 64 formed in the trench 62 illustrated in FIG. 14C can be prevented from transforming into an N type silicon layer and can be formed with a predetermined thickness.

A silicon oxide layer naturally formed on the silicon substrate 61, an etching mask and a reaction product due to the trench etching are then removed by hydrofluoric acid (HF).

Figure 13B:
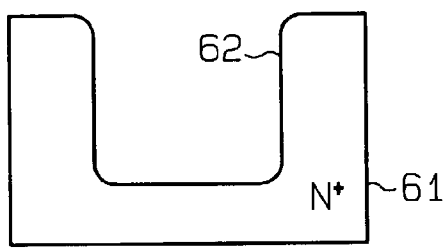
Figure 13C:
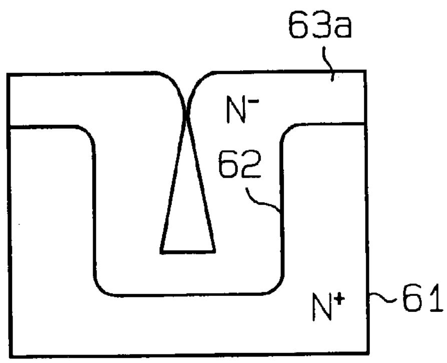

As shown in FIG. 13B, the silicon substrate 61 is inserted in a heat furnace and is heated by an annealing treatment to round corners of a bottom portion and an opening portion of the trench 62 and to remove a surface roughness and crystal defects in the side walls of the trench 62. As shown in FIG. 13C, an N− silicon layer 63a is then formed on the silicon substrate 61 including the trench 62 by epitaxial growth.

Figure 13D:
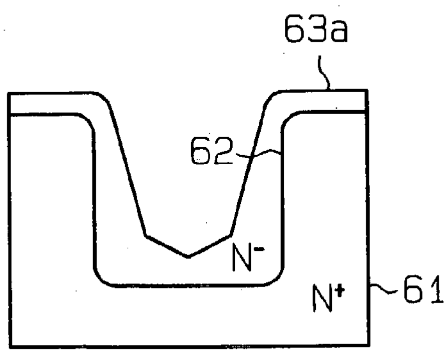

As shown in FIG. 13D, a part of the silicon layer 63a is removed by etching based on vapor phase etching effect of hydrogen chloride (HCl) or a halogenated compound with an atmospheric gas including HCl or a halogenated compound. As a result, because a portion of the N− silicon layer 63a located on the opening portion of the trench 62 is deeply removed, side walls of the trench 62 are tapered.

Figure 14A:
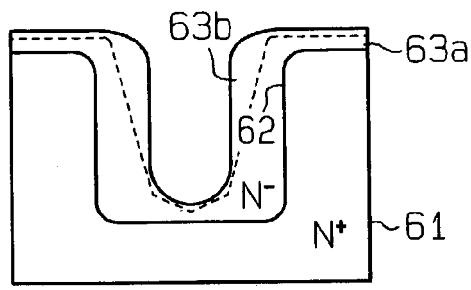
FIGS. 14A to 14C are cross sectional views showing production processes of the semiconductor device following FIG. 13D.
Figure 14B:
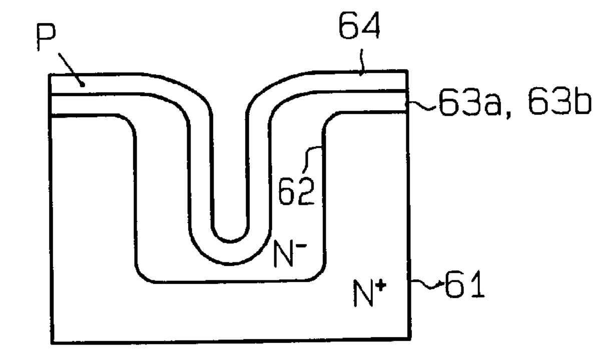

Successively, as shown in FIG. 14A, an N− type layer 63b is formed onto the silicon substrate 61 including the trench 62 by eptaxial growth to cover the N− type silicon layer 63a. As shown in FIG. 14B, a P type silicon layer 64 is then formed onto the silicon substrate 62 including the trench 62 by eptaxial growth to cover the $N^-$ type silicon layer 63b.

Figure 14C:
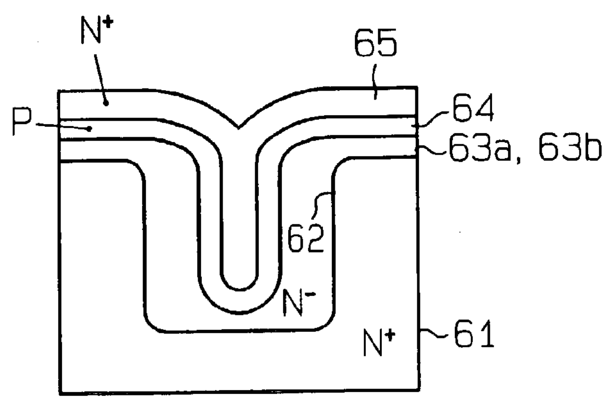

Further, as shown in FIG. 14C, an N+ type silicon layer 65 is formed onto the silicon substrate 61 including the trench 62 by eptaxial growth to cover the P type silicon layer 64. A heat treatment is performed on the silicon substrate 61 to decrease voids formed in the trench 62. Surfaces of the respective layers 63a, 63b, 64 and 65 are flattened.

In the sixth embodiment, the aspect ratio of the trench 62 is defined to be low. The lower the aspect ratio of the trench 62 is defined, the fewer the P type silicon layer 64 is transformed in N type at the bottom portion of the trench 62.

Figure 21:
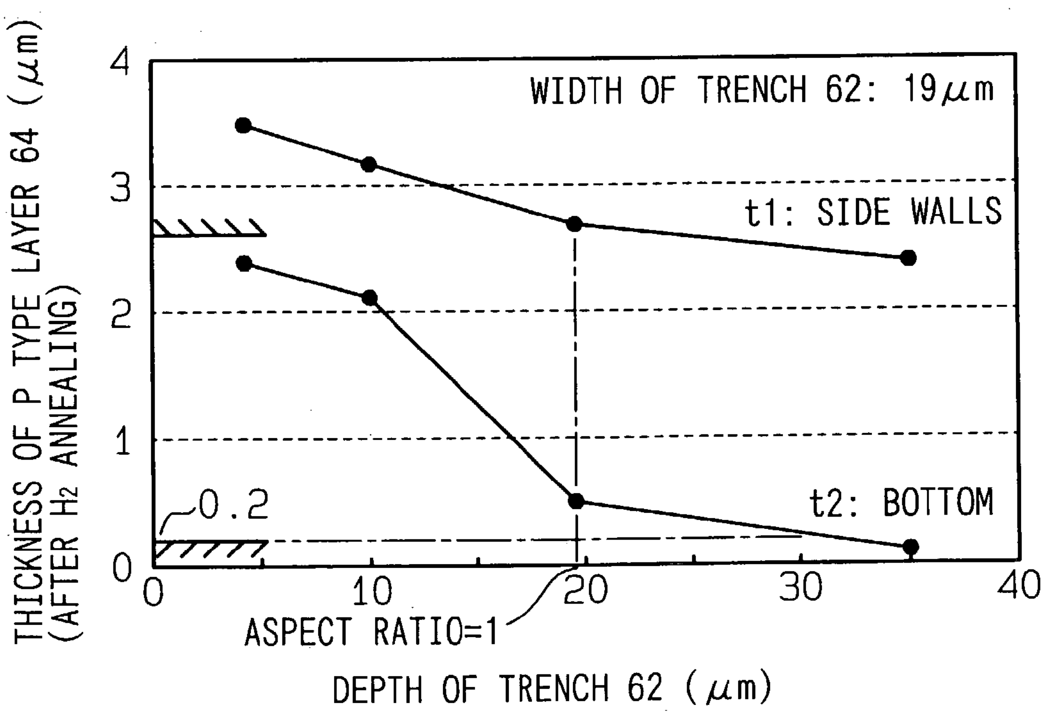
FIG. 21 shows a relationship between a depth of a trench and a thickness of a P type layer according to the seventh embodiment.
Figure 20A:
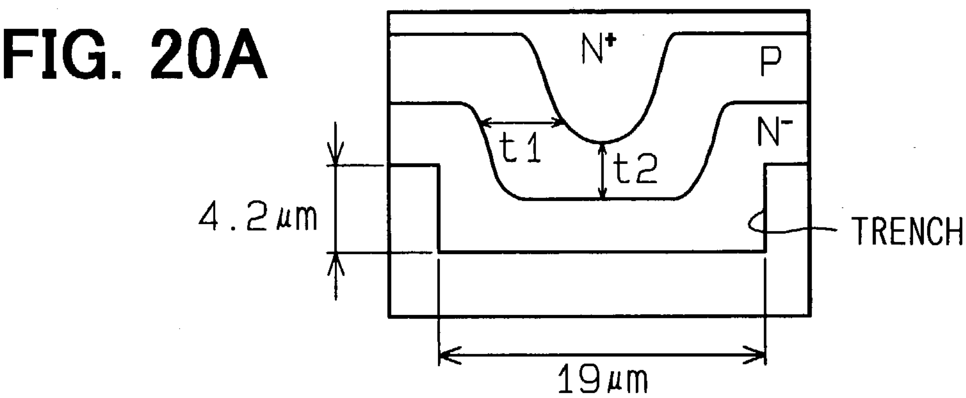
FIGS. 20A to 20C show cross sectional views showing the semiconductor device based on the SCM analysis when an aspect ratio changes according to the seventh embodiment.
Figure 20B:
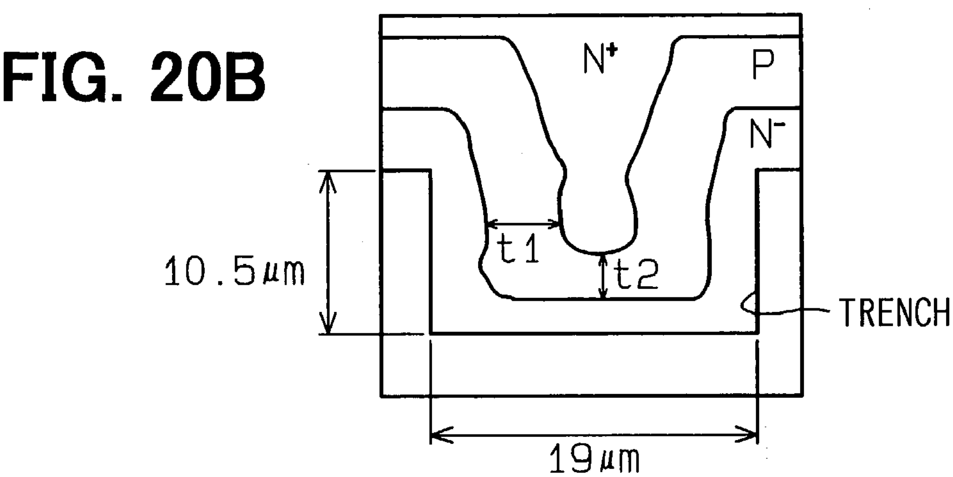
Figure 20C:
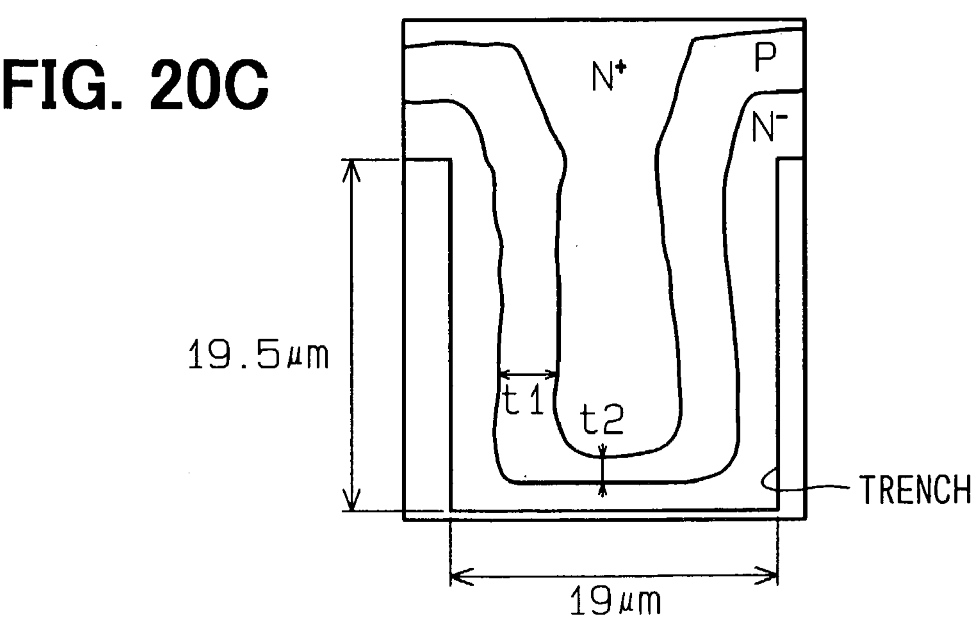
Figure 22A:
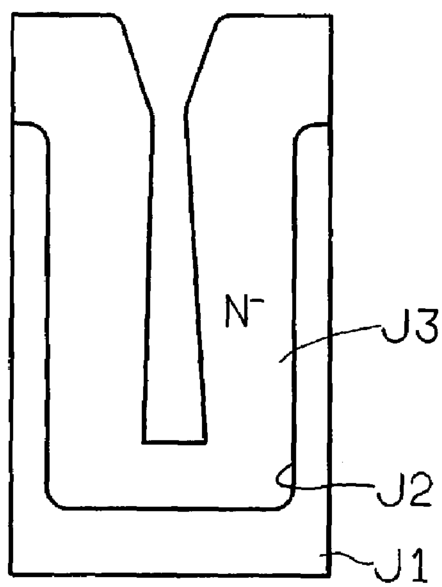
FIGS. 22A to 22D are cross sectional views showing production processes according to a related art semiconductor device.
Figure 22B:
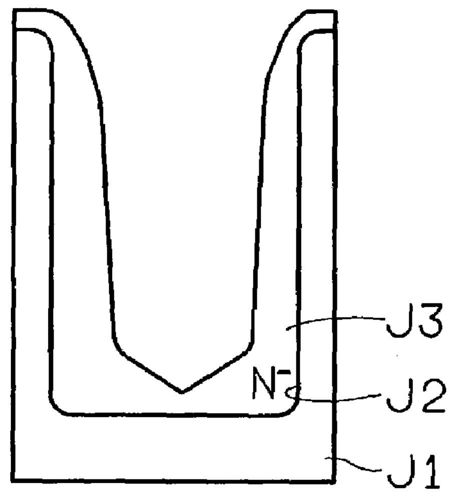
Figure 22C:
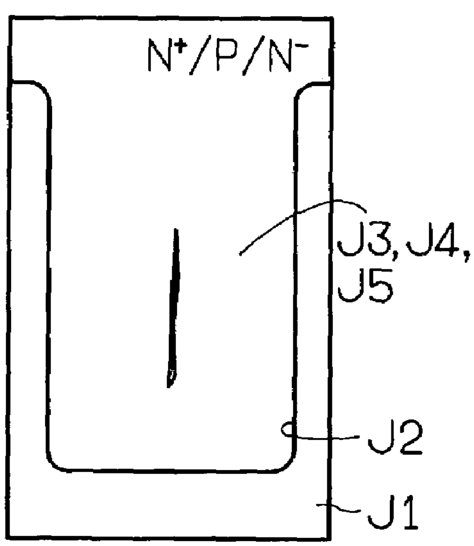
Figure 22D:
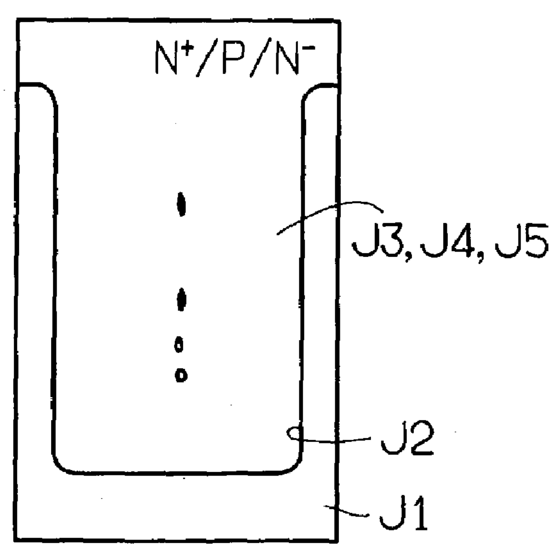

FIGS. 20A to 20C show cross sectional views showing SCM analysis of semiconductor devices in which depths of the trench 62 are defined in 4.2 μm, 10.5 μm and 19.5 μm, respectively. FIG. 21 shows a relationship between a depth of the trench 62 and a thickness of portions of the P type silicon layer 64 located at the bottom portion and the side walls of the trench 62.

As shown in FIG. 21, when the aspect ratio of the trench 62 is set to more than 1, the P type silicon layer 64 is exponentially transformed to an N type silicon layer at the bottom portion of the trench 62, and a change of a thickness t2 thereof exponentially decreases. Therefore, the aspect ratio of the trench 62 is preferably set to more than 1.

From a practical standpoint, in order to electrically isolate a source region and a drain region, a portion of the P type silicon layer 62 at which a channel is formed is set to at least 0.2 μm. Therefore, the depth of the trench 62 is preferably set to 30 μm or less. That is, the aspect ratio of the trench 62 is set to 1.6 (=30 μm/19 μm).

Incidentally, an integration of the semiconductor device is restricted in a direction perpendicular to the silicon substrate 61 due to the low aspect ratio of the trench 62. Therefore, characteristics of a three-dimensional power MOSFET are also restricted. However, if the three-dimension power MOSFET is formed by a simple ion diffusion process from a surface of the silicon substrate 61, the aspect ratio of the trench 62 is basically at most 0.5 because ions are isotropically diffused. Substantially, criteria of stable machining, heat treatment period and the like restrict the aspect ratio to be at most 0.2. Therefore, the three-dimensional power MOSFET formed by the manufacturing process of the seventh embodiment is superior to that formed by simple ion diffusion processes even if the aspect ratio of the trench 62 is set to a value between 0.2 and 1.6.

According to the seventh embodiment, the semiconductor device can be completed without additional manufacturing equipment with respect to the related art semiconductor device disclosed in JP-A-2001-274398.

The trench 62 having an aspect ratio of 1.6 or less is formed in the silicon substrate 61. As a result, a semiconductor device including the three-layered structure having a first conductive layer/a second conductive layer/a first conductive layer formed into a trench can prevent the second conductive layer from being too thin.

(Modification)

In the fourth embodiment, the P type silicon layer 34 can alternatively be formed by additional epitaxial growth. That is, after a part of the P type silicon layer 34 is formed by vapor phase diffusion, another part of the P type silicon layer 34 can be formed by epitaxial growth. In this case, the P type layer is formed by vapor phase diffusion and epitaxial growth, both of which are preferably performed in an identical vacuum chamber.

In the fourth embodiment, P type doping impurities including, for example, boron (B) or a composition including the P type doping impurities can alternatively be adopted to a source of the vapor diffusion instead of the $B_2H_6$ gas. When the conductivity type of the respective components 31–35 is reversed, an N type silicon layer corresponding to the P type silicon layer 34 of the fourth embodiment can be formed with N type doping impurities or with a composition including the N type doping impurities such as $PH_3$ or $AsH_3$. In other words, an impurity layer formed by vapor diffusion can be formed by introducing doping impurities or a composition including doping impurities into an atmospheric gas.

In the fifth embodiment, the corners of the trench 42 can alternatively be rounded by isotropic etching or by removing a thermal oxide layer after a surface of the silicon substrate 41 including inside walls of the trench 42 is sacrificially oxidized.

While the above description is of the preferred embodiments of the present invention, it should be appreciated that the invention may be modified, altered, or varied without deviating from the scope and fair meaning of the following claims.

What is claimed is:

1. A method for manufacturing a semiconductor device comprising:

forming a trench in a semiconductor substrate;

forming a first epitaxial layer formed of a first conductive type semiconductor on the semiconductor substrate including the trench by epitaxial growth;

removing a portion of the first epitaxial layer by vapor phase etching using a halogenated compound or hydrogen;

forming a second epitaxial layer formed of the first conductive type semiconductor on the semiconductor substrate including the trench by epitaxial growth to cover the first epitaxial layer;

forming a third epitaxial layer formed of a second conductive type semiconductor on the semiconductor substrate including the trench by epitaxial growth to cover the second epitaxial layer;

forming a fourth epitaxial layer formed of the first conductive type semiconductor on the semiconductor substrate including the trench by epitaxial growth to cover the third epitaxial layer; and flattening surfaces of the first to fourth epitaxial layers formed on the semiconductor substrate;

wherein the removing includes removing the portion of the first epitaxial layer at a predetermined temperature higher than that during epitaxial growth of the first epitaxial layer and at a predetermined pressure higher than that during epitaxial growth of the first epitaxial layer.

2. The method according to claim 1, wherein the predetermined temperature is set between 850° C. and 1300° C.

3. The method according to claim 1, wherein the predetermined temperature is set between 1100° C. and 1200° C.

4. The method according to claim 1, wherein the predetermined pressure is set between 10 torr and 760 torr.

5. The method according to claim 1, wherein the predetermined pressure is set to a pressure between 300 torr and 600 torr.

6. The method according to claim 1, wherein the removing includes removing the portion of the first epitaxial layer under an atmospheric gas with a non-oxidizing and non-nitrizing gas.

7. The method according to claim 6, wherein the non-oxidizing and non-nitrizing gas includes one of a hydrogen gas and a noble gas.

8. A method for manufacturing a semiconductor device comprising:

forming a trench in a semiconductor substrate;

forming a first epitaxial layer formed of a first conductive type semiconductor on the semiconductor substrate including the trench by epitaxial growth;

removing a portion of the first epitaxial layer by vapor phase etching using halogenated compound or hydrogen;

forming a second epitaxial layer formed of the first conductive type semiconductor on the semiconductor substrate including the trench by epitaxial growth to cover the first epitaxial layer;

heating the semiconductor substrate for relaxing stress that would otherwise be concentrated at a bottom portion of the trench;

forming a third epitaxial layer formed of a second conductive type semiconductor on the semiconductor substrate including the trench by epitaxial growth to cover the second epitaxial layer;

forming a fourth epitaxial layer formed of the first conductive type semiconductor on the semiconductor substrate including the trench by epitaxial growth to cover the third epitaxial layer; and flattening surfaces of the first to fourth epitaxial layers formed on the semiconductor substrate;

wherein the heating is performed between the forming the second epitaxial layer and the forming of the third epitaxial layer.

9. The method according to claim 8, wherein the heating includes heating at a predetermined temperature between 850° C. and 1300° C.

10. The method according to claim 8, wherein the heating includes heating at a predetermined temperature between 1100° C. and 1200° C.

11. A method for manufacturing a semiconductor device comprising:

forming a trench in a semiconductor substrate;

forming a first epitaxial layer formed of a first conductive type semiconductor on the semiconductor substrate including the trench by epitaxial growth;

removing a portion of the first epitaxial layer by vapor phase etching using halogenated compound or hydrogen;

forming a second epitaxial layer formed of the first conductive type semiconductor on the semiconductor substrate including the trench by epitaxial growth to cover the first epitaxial layer;

forming a third epitaxial layer formed of a second conductive type semiconductor on the semiconductor substrate including the trench by epitaxial growth to cover the second epitaxial layer;

heating the semiconductor substrate for relaxing stress that would otherwise be concentrated at a bottom portion of the trench;

forming a fourth epitaxial layer formed of the first conductive type semiconductor on the semiconductor substrate including the trench by epitaxial growth to cover the third epitaxial layer; and flattening surfaces of the first to fourth epitaxial layers formed on the semiconductor substrate;

wherein the heating is performed after the forming of the third epitaxial layer.

12. The method according to claim 11, wherein the forming of the third epitaxial layer is performed several times, and the heating is performed after each repetition of the forming of the third epitaxial layer.

13. The method according to claim 12, wherein the heating includes heating at a predetermined temperature between 850° C. and 1300° C.

14. The method according to claim 12, wherein the heating includes heating at a predetermined temperature between 1100° C. and 1200° C.

15. A method for manufacturing a semiconductor device comprising:

forming a trench in a semiconductor substrate;

forming a first epitaxial layer formed of a first conductive type semiconductor on the semiconductor substrate including the trench by epitaxial growth;

removing a portion of the first epitaxial layer by vapor phase etching using halogenated compound or hydrogen;

forming a second epitaxial layer formed of the first conductive type semiconductor on the semiconductor substrate including the trench by epitaxial growth to cover the first epitaxial layer;

forming an ion diffusion layer formed of a second conductive type semiconductor at a surface portion of the second epitaxial layer including the trench by vapor diffusion;

forming a third epitaxial layer formed of the first conductive type semiconductor on the semiconductor substrate including the trench by epitaxial growth to cover the second epitaxial layer; and flattening surfaces of the first to third epitaxial layers and the ion diffusion layer formed on the semiconductor substrate.

16. The method according to claim 15, wherein the forming of the ion diffusion layer is performed at predetermined temperature at least 1000° C.

17. The method according to claim 15, wherein the forming of the ion diffusion layer is performed at predetermined temperature at least 1100° C.

18. The method according to claim 15, wherein the forming of the ion diffusion layer is performed under an atmosphere with one of second conductive type impurities and a composition including the second conductive type impurities.

19. A method for manufacturing a semiconductor device comprising:

forming a trench in a semiconductor substrate;

forming a first epitaxial layer formed of a first conductive type semiconductor on the semiconductor substrate including the trench by epitaxial growth;

removing a portion of the first epitaxial layer by vapor phase etching using a halogenated compound or hydrogen;

forming a second epitaxial layer formed of the first conductive type semiconductor on the semiconductor substrate including the trench by epitaxial growth to cover the first epitaxial layer;

forming an ion diffusion layer formed of a second conductive type semiconductor at a surface portion of the second epitaxial layer including the trench by vapor diffusion;

forming a third epitaxial layer formed of the second conductive type semiconductor on the semiconductor substrate including the trench by epitaxial growth to cover the ion diffusion layer;

forming a fourth epitaxial layer formed of the first conductive type semiconductor on the semiconductor substrate including the trench by epitaxial growth to cover the third epitaxial layer; and flattening surfaces of the first to fourth epitaxial layers and the ion diffusion layer formed on the semiconductor substrate.

20. The method according to claim 19, wherein the forming of the ion diffusion layer is performed at predetermined temperature at least 1000° C.

21. The method according to claim 19, wherein the forming of the ion diffusion layer is performed at predetermined temperature at least 1100° C.

22. The method according to claim 19, wherein the forming of the ion diffusion layer is performed under an atmosphere with one of second conductive type impurities and a composition including the second conductive type impurities.

23. A method for manufacturing a semiconductor device comprising:

forming a trench in a semiconductor substrate so that an aspect ratio thereof is set in at most 1.6;

forming a first epitaxial layer formed of a first conductive type semiconductor on the semiconductor substrate including the trench by epitaxial growth;

removing a portion of the first epitaxial layer by vapor phase etching using a halogenated compound or hydrogen;

forming a second epitaxial layer formed of the first conductive type semiconductor on the semiconductor substrate including the trench by epitaxial growth to cover the first epitaxial layer;

forming a third epitaxial layer formed of a second conductive type semiconductor on the semiconductor substrate including the trench by epitaxial growth to cover the second epitaxial layer;

forming a fourth epitaxial layer formed of the first conductive type semiconductor on the semiconductor substrate including the trench by epitaxial growth to cover the third epitaxial layer; and flattening surfaces of the first to fourth epitaxial layers formed on the semiconductor substrate.

24. The method according to claim 23, wherein the forming of the trench includes forming the trench so that an aspect ratio is set in a value between 0.2 and 1.6.

* * * * *